United States Patent
Lee et al.

(10) Patent No.: US 10,338,437 B2
(45) Date of Patent: Jul. 2, 2019

(54) DISPLAY DEVICE AND MANUFACTURING METHOD THEREOF

(71) Applicant: SAMSUNG DISPLAY CO., LTD., Yongin, Gyeonggi-Do (KR)

(72) Inventors: Seon Uk Lee, Seongnam-si (KR); Yeun Tae Kim, Suwon-si (KR); Seong Gyu Kwon, Suwon-si (KR); Nam Seok Roh, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 549 days.

(21) Appl. No.: 13/680,024

(22) Filed: Nov. 17, 2012

(65) Prior Publication Data

US 2013/0293799 A1 Nov. 7, 2013

(30) Foreign Application Priority Data

May 7, 2012 (KR) .......................... 10-2012-0048266

(51) Int. Cl.
*G02F 1/1339* (2006.01)
*H01L 33/00* (2010.01)
*G02F 1/1333* (2006.01)
*G02F 1/1341* (2006.01)

(52) U.S. Cl.
CPC ........ *G02F 1/13394* (2013.01); *G02F 1/1341* (2013.01); *G02F 1/133305* (2013.01); *G02F 1/133377* (2013.01); *H01L 33/005* (2013.01)

(58) Field of Classification Search
CPC . G02F 1/136; G02F 1/13394; G02F 1/133377
USPC .................................................. 349/155–157
See application file for complete search history.

(56) References Cited

U.S. PATENT DOCUMENTS

| | | | |
|---|---|---|---|
| 6,184,967 B1 | 2/2001 | Lagerwall et al. | |
| 7,538,850 B2* | 5/2009 | Kim ..................... | G02F 1/13394 349/106 |
| 2005/0099578 A1 | 5/2005 | Kim et al. | |
| 2005/0117092 A1 | 6/2005 | Park et al. | |
| 2006/0139515 A1* | 6/2006 | Baek ............................. | 349/106 |
| 2007/0002219 A1* | 1/2007 | Lee ..................... | G02F 1/13394 349/106 |
| 2007/0019137 A1* | 1/2007 | Kim ..................... | G02F 1/1341 349/114 |
| 2008/0068553 A1 | 3/2008 | Tomita et al. | |

(Continued)

FOREIGN PATENT DOCUMENTS

| | | |
|---|---|---|
| CN | 1614488 A | 5/2005 |
| CN | 1621917 A | 6/2005 |

(Continued)

*Primary Examiner* — Michael H Caley
*Assistant Examiner* — Agnes Dobrowolski
(74) *Attorney, Agent, or Firm* — Cantor Colburn LLP

(57) ABSTRACT

A display device includes: a substrate including a plurality of pixel areas; a thin film transistor on the substrate; a pixel electrode connected to the thin film transistor; an roof layer connected between pixel areas adjacent in a first direction and separated from the pixel electrode; a column protruded from the roof layer in a boundary portion of the pixel areas; a space between the pixel electrode and the roof layer, the roof layer partially overlapping an upper inner wall and a first side inner wall of the space and exposing a second side inner wall of the space; a liquid crystal in the space.

12 Claims, 26 Drawing Sheets

(56) References Cited

U.S. PATENT DOCUMENTS

| | | |
|---|---|---|
| 2008/0315755 A1 | 12/2008 | Han |
| 2010/0007826 A1* | 1/2010 | Lu .................. G02F 1/133707 349/114 |
| 2010/0165282 A1* | 7/2010 | Mochizuki .......... G02F 1/13394 349/155 |
| 2011/0001910 A1* | 1/2011 | Fujiyoshi ............ G02F 1/13394 349/106 |
| 2011/0085123 A1 | 4/2011 | Kim et al. |
| 2011/0153284 A1 | 6/2011 | Li et al. |
| 2011/0273647 A1 | 11/2011 | Kim et al. |
| 2012/0062448 A1* | 3/2012 | Kim ................ G02F 1/133377 345/55 |

FOREIGN PATENT DOCUMENTS

| | | |
|---|---|---|
| CN | 1987628 A | 6/2007 |
| CN | 202025167 U | 11/2011 |
| JP | 11281983 A | 10/1999 |
| JP | 2001100219 A | 4/2001 |
| JP | 2002350860 A | 12/2002 |
| JP | 2004078107 A | 3/2004 |
| JP | 2011013618 A | 1/2011 |
| JP | 2011086527 A | 4/2011 |
| KR | 100218507 B1 | 6/1999 |
| KR | 1020020090487 A | 12/2002 |
| KR | 100414819 B1 | 12/2003 |
| KR | 1020040024671 A | 3/2004 |
| KR | 1020040085529 A | 10/2004 |
| KR | 1020060082470 A | 7/2006 |
| KR | 1020070033702 A | 3/2007 |
| KR | 1020070117271 A | 12/2007 |
| KR | 1020110109049 A | 10/2011 |
| KR | 1020120026880 A | 3/2012 |
| WO | 2006100713 A1 | 9/2006 |

* cited by examiner

DISPLAY DEVICE AND MANUFACTURING METHOD THEREOF

This application claims priority to Korean Patent Application No. 10-2012-0048266 filed on May 7, 2012, and all the benefits accruing therefrom under 35 U.S.C. § 119, the entire contents of which are incorporated herein by reference.

BACKGROUND (a) Field

The invention relates to a display device and a manufacturing method thereof. More particularly, the invention relates to a display device and a manufacturing method thereof, including a structure that reduces weight, thickness, cost and manufacturing time and has rigidity.

(b) Description of the Related Art

A liquid crystal display is one of the most widely used flat panel displays. The liquid crystal display includes two display panels on which field generating electrodes such as a pixel electrode and a common electrode are disposed, and a liquid crystal layer that is disposed therebetween. The liquid crystal display shows an image by applying a voltage to the field generating electrodes to generate an electric field in the liquid crystal layer, which determines alignment of liquid crystal molecules of the liquid crystal layer and controls polarization of incident light.

The two display panels forming the liquid crystal display may include a thin film transistor array panel and an opposing display panel. The thin film transistor array panel may include a gate line transmitting a gate signal, a data line crossing the gate line and transmitting a data signal, a thin film transistor connected to the gate line and data line, and a pixel electrode connected to the thin film transistor. The opposing display panel may include a light blocking member, a color filter, a common electrode, etc. If necessary, the light blocking member, the color filter, and the common electrode may be in the thin film transistor array panel.

SUMMARY

One or more exemplary embodiment of the invention provides a display device and a manufacturing method thereof, with reduced weight, thickness, cost and processing time by manufacturing the display device using only one substrate.

One or more exemplary embodiment of the invention provides a display device and a manufacturing method thereof, having a rigid structure that endures an external pressure while the structure includes one substrate.

An exemplary embodiment of a display device according to the invention includes: a substrate including a plurality of pixel areas; a thin film transistor on the substrate; a pixel electrode connected to the thin film transistor; an roof layer connected between pixel areas adjacent in a first direction and separated from the pixel electrode; a column protruded from the roof layer in a boundary portion of the pixel areas; a space between the pixel electrode and the roof layer, the roof layer partially overlapping an upper inner wall and a first side inner wall of the space and exposing a second side inner wall of the space; a liquid crystal in the space.

A common electrode under the roof layer and separated from the pixel electrode may be further included.

The column may be integral with the roof layer.

The column may be bar-shaped and extend in a second direction perpendicular to the first direction.

A plurality of columns may be disposed at a predetermined interval in the second direction perpendicular to the first direction.

The column may be a circular cylinder or a quadrangular column.

The column may be lattice-shaped including portions in the first direction and in a second direction perpendicular to the first direction, crossing each other.

The column may be at a position where the boundary portion of the pixel areas parallel to the first direction and the boundary portion of the pixel areas perpendicular to the first direction cross each other.

The column may be cross-shaped.

The roof layer may include color filters of different colors in the pixel areas adjacent in the first direction, the color filters may overlap each other in the boundary portion of the pixel areas, and the overlapping portion of the color filter may define the column.

An overcoat overlapping the second side inner wall of the space exposed by the roof layer may be further included.

An exemplary embodiment of a manufacturing method of a display device according to the invention includes: forming a thin film transistor on a substrate including a plurality of pixel areas; forming a pixel electrode connected to the thin film transistor; forming a sacrificial layer separated between pixel areas adjacent in a first direction and connected between pixel areas adjacent in a second direction perpendicular to the first direction, on the pixel electrode; forming an roof layer on the sacrificial layer; patterning the roof layer to form a liquid crystal injection hole exposing a portion of the sacrificial layer at facing edges of the adjacent pixel areas; forming a column protruded from the roof layer on the boundary portion of the pixel areas; removing the sacrificial layer to form a space between the pixel electrode and the roof layer; injecting a liquid crystal to the space through the liquid crystal injection hole.

The method may further include forming a common electrode on the sacrificial layer, and in the forming of the liquid crystal injection hole, the common electrode is patterned to expose the portion of the sacrificial layer at the facing edges of the adjacent pixel areas.

The liquid crystal injection hole and the column may be simultaneously formed by using a half-tone mask or a slit mask.

The column may be formed in a bar shape extending in the second direction.

A plurality of columns may be formed at a predetermined interval in the second direction.

The column may be formed as a circular cylinder or quadrangular column.

The column may be formed in a lattice shape including portions in the first direction and portions in a second direction perpendicular to the first direction, the portions crossing each other.

The column may be formed at a position where the boundary portion of the pixel areas parallel to the first direction and the boundary portion of the pixel areas perpendicular to the first direction cross each other.

The column may be formed in a cross shape.

The roof layer may include color filters of different colors in the pixel areas adjacent in the first direction, the color filters may overlap each other on the boundary portion of the pixel areas, and the overlapping portion of the color filters may define the column.

As described above, one or more exemplary embodiment of the display device and the manufacturing method thereof according to the invention has effects as follows.

The exemplary embodiment of a manufacturing method according to the invention manufactures the display device by using only one substrate, thereby reducing weight, thickness, cost and process time.

Also, the column is formed to be protruded from the roof layer on the boundary portion of between pixel areas such a force applied to the display device is transmitted to the column, and thereby a space between a pixel electrode and the roof layer may be maintained and the roof layer may not collapse or deform.

Also, the roof layer and the column are simultaneously formed by using the half-tone mask or the slit mask, thereby forming the column without an additional process.

The method may further include forming an overcoat on the roof layer to seal the liquid crystal injection hole.

BRIEF DESCRIPTION OF THE DRAWINGS

The above and other features of this disclosure will become more apparent by describing in further detail exemplary embodiments thereof with reference to the accompanying drawings, in which.

DETAILED DESCRIPTION

Figure 1:
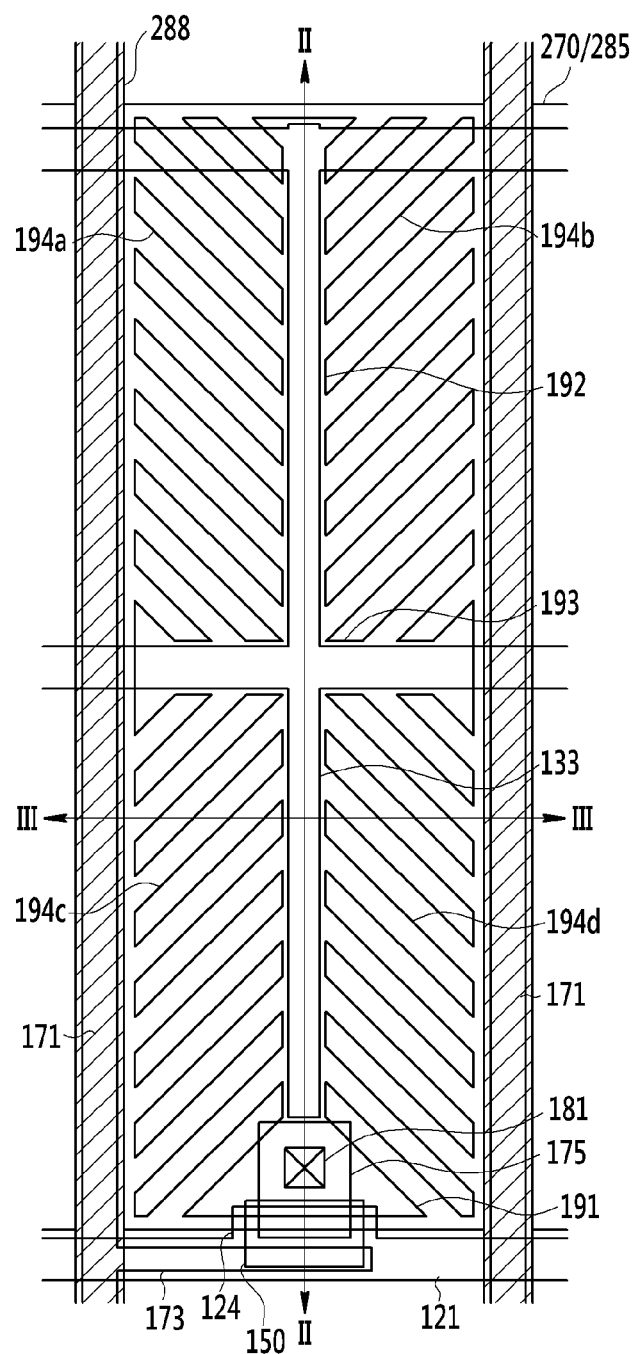
FIG. 1 is a top plan view of an exemplary embodiment of one pixel of a display device according to the invention.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" or "lower" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

In a conventional liquid crystal display, two substrates are inevitably required, and the constituent elements of the liquid crystal display are respectively on the two substrates such that the display device is undesirably heavy, the cost is undesirably high and the processing time is undesirably long.

Exemplary embodiments of a display device according to the invention will be described with reference to accompanying drawings.

Figure 2:
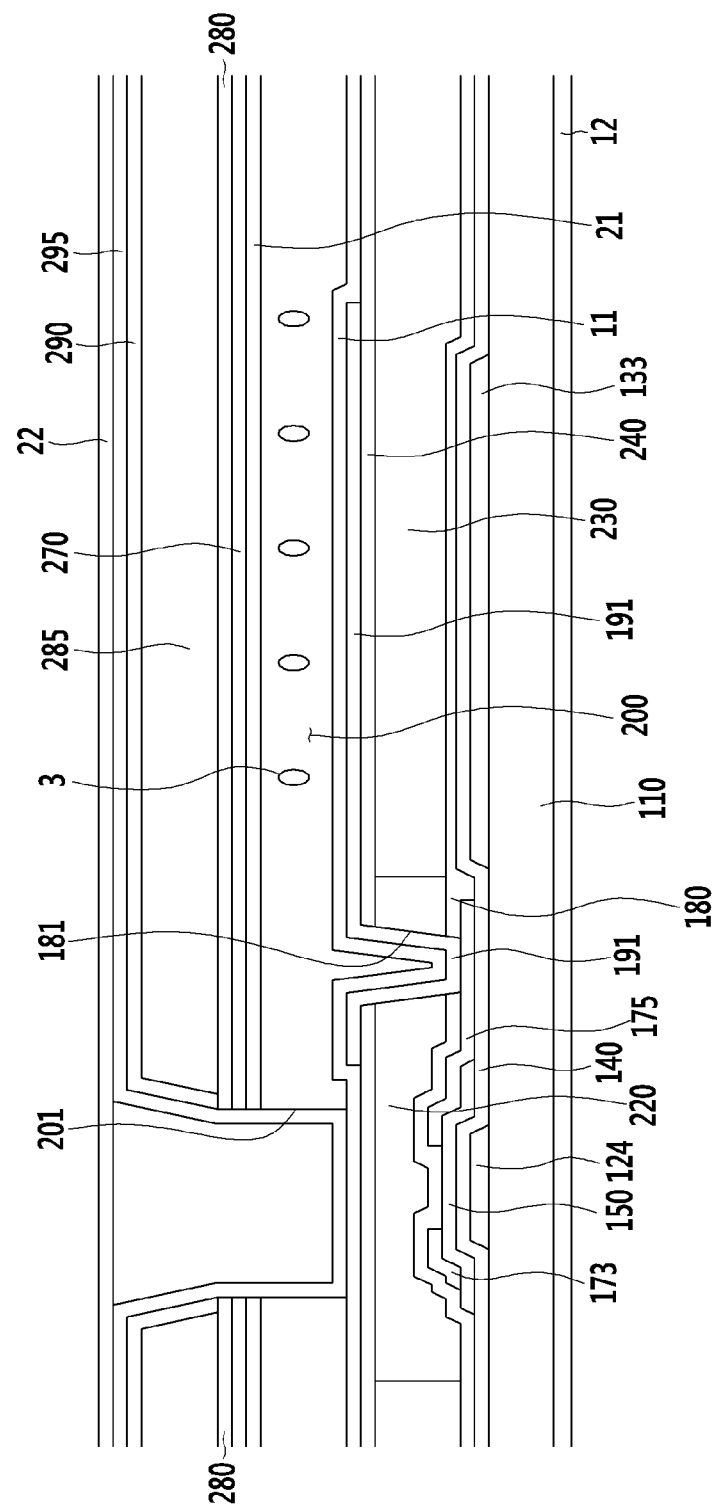
FIG. 2 is a cross-sectional view showing the one pixel of the display device according to the invention taken along line II-II of FIG. 1.
Figure 3:
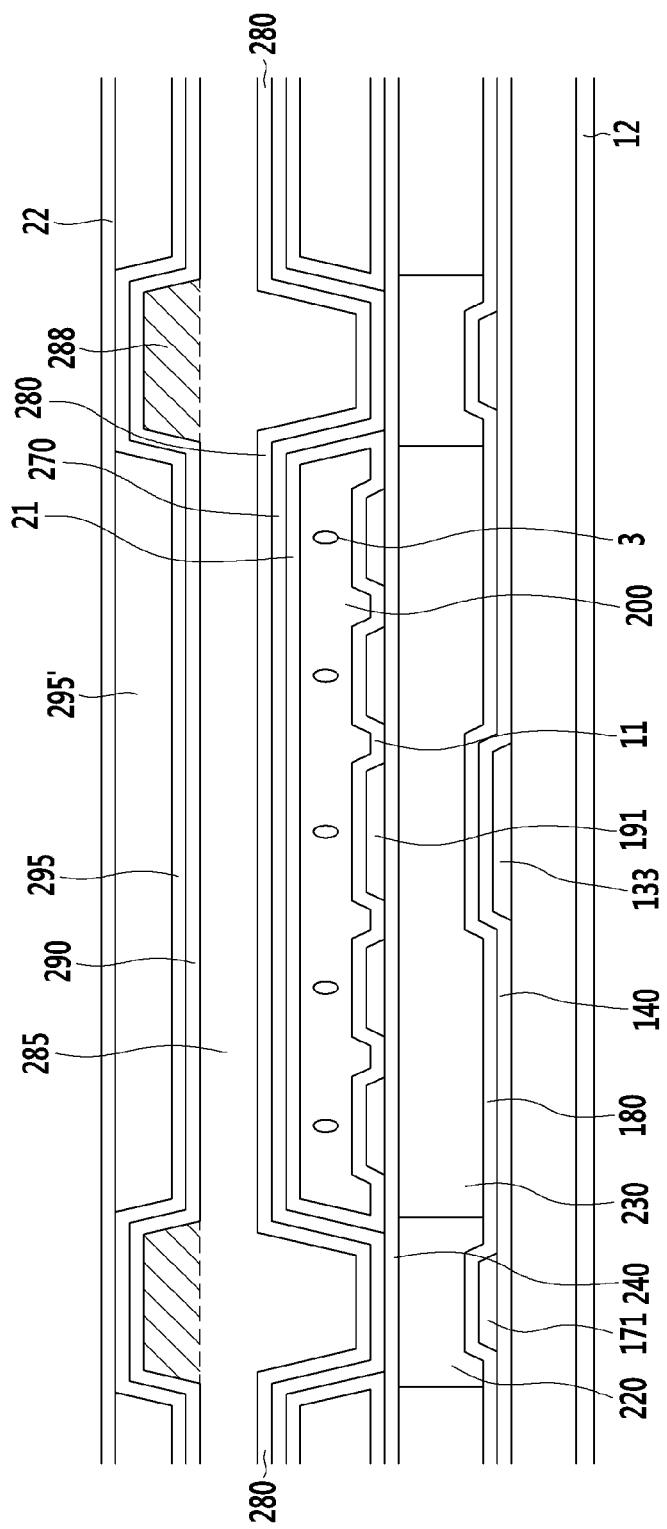
FIG. 3 is a cross-sectional view showing the one pixel of the display device according to the invention taken along line III-III of FIG. 1.
Figure 4:
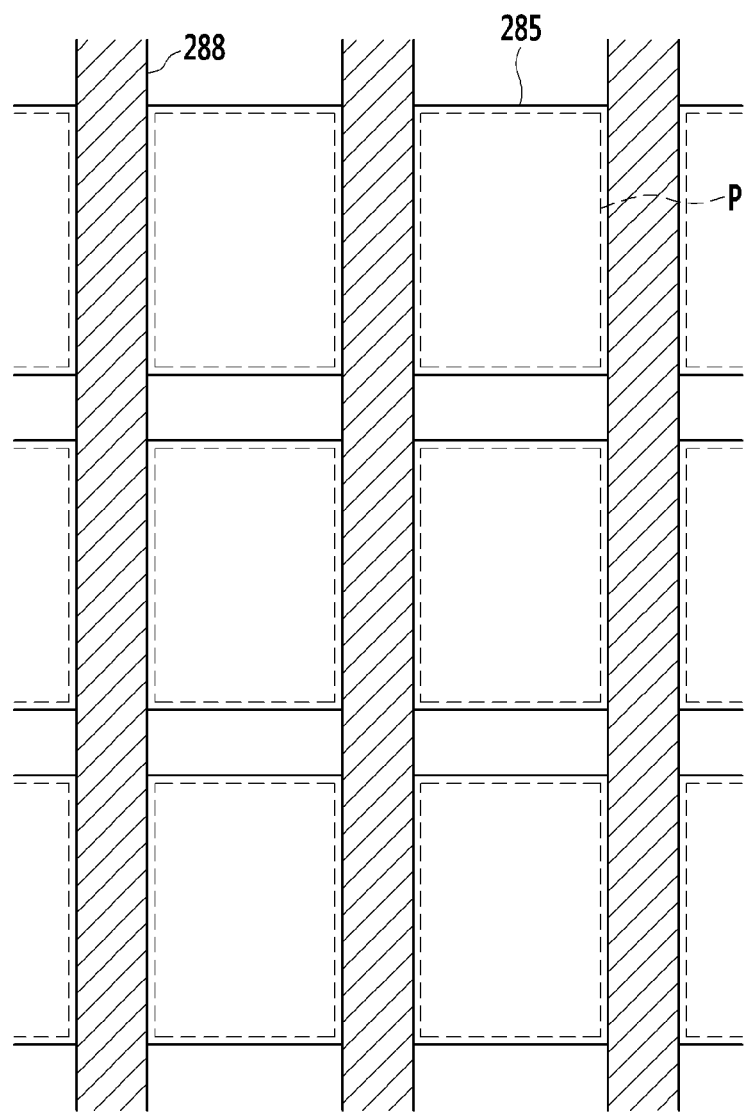
FIG. 4 is a top plan view showing an exemplary embodiment of a plurality of pixels of a display device according to the invention.

FIG. 1 is a top plan view of an exemplary embodiment of one pixel of a display device according to the invention, and FIG. 2 is a cross-sectional view showing the one pixel of the display device according to the invention taken along line II-II of FIG. 1. FIG. 3 is a cross-sectional view showing the one pixel of the display device according to the invention taken along line III-III of FIG. 1, and FIG. 4 is a top plan view showing an exemplary embodiment of a plurality of pixels of a display device according to the invention.

An exemplary embodiment of a display device according to the invention includes a gate line 121 having a longitudinal axis which extends in a first direction and a data line 171 having a longitudinal axis which extends in a second direction different from the first direction, on a substrate 110. The substrate 110 may include, but is not limited to, glass or plastic. The gate line 121 and the data line 171 may cross each other.

The substrate 110 includes a plurality of pixel areas P. The plurality of pixel areas P may be arranged in a matrix shape in the plan view. A pixel area P may be defined by gate lines 121 and data lines 171 that are crossed with each other, but is not limited thereto or thereby.

Each gate line 121 extends mainly in a transverse (e.g., first) direction and transmits a gate signal. Also, each gate line 121 includes a gate electrode 124 protruded therefrom. The gate electrode 124 is applied with the gate signal through the gate line 121.

A storage electrode 133 not connected to the gate line 121 and the gate electrode 124, may be in the pixel area P. As shown, the storage electrode 133 may have a longitudinal axis which extends in a direction parallel to the data line 171. Alternatively, the storage electrode 133 may have a longitudinal axis which extends in a direction parallel to the gate line 121. A plurality of storage electrodes 133 in neighboring pixel areas may be continuous and/or connected to each other. Each storage electrode 133 may be applied with a predetermined voltage such as a common voltage.

A gate insulating layer 140 is on the gate line 121, the gate electrode 124 and the storage electrode 133. The gate insulating layer 140 may include an inorganic insulating material such as silicon nitride (SiNx) or silicon oxide (SiOx). Also, the gate insulating layer 140 may have a single layer structure or a multilayer structure.

A semiconductor layer 150 is on the gate insulating layer 140. The semiconductor layer 150 may be positioned on and overlapping the gate electrode 124. Also, the semiconductor layer 150 may be extended under the data line 171. The semiconductor layer 150 may include amorphous silicon, polycrystalline silicon or a metal oxide.

A source electrode 173 continuous with and protruded from the data line 171, and a drain electrode 175 separated from the source electrode 173, are on the semiconductor layer 150.

The data line 171 extends mainly in a longitudinal (e.g., second) direction and transmits a data signal. The data signal transmitted through the data line 171 is applied to the source electrode 173.

The gate electrode 124, the semiconductor layer 150, the source electrode 173 and the drain electrode 175 form one thin film transistor. When the thin film transistor is in an on state, the data signal applied to the source electrode 173 is transmitted to the drain electrode 175.

A passivation layer 180 is on the data line 171, the source electrode 173, the drain electrode 175 and an exposed portion of the semiconductor layer 150 between the drain electrode 175 and the drain electrode 173. The passivation layer 180 may include an organic insulating material or an inorganic insulating material, and may have a single layer structure or a multilayer structure.

A color filter 230 is in each pixel area P and on the passivation layer 180. The display device may include a plurality of color filters 230. Each of color filters 230 may display one of primary colors such as three primary colors of red, green and blue. The color filter 230 is not limited to the three primary colors of red, green and blue, and may represent colors such as cyan, magenta, yellow and a white-containing color.

A light blocking member 220 is in a region between neighboring color filters 230. The light blocking member 220 is on the boundary of the pixel area P and the thin film transistor, thereby preventing light leakage.

A first insulating layer 240 may be further on the color filter 230 and the light blocking member 220. The first insulating layer 240 may include the inorganic insulating material such as silicon nitride (SiNx) or silicon oxide (SiOx). The first insulating layer 240 functions to protect the color filter 230 including the organic material and the light blocking member 220, and may be omitted in an alternative exemplary embodiment if desired.

A contact hole 181 extends through thicknesses of the first insulating layer 240, the light blocking member 220 and the passivation layer 180, and exposes a portion of the drain electrode 175. Alternatively, the contact hole 181 may extend through a thickness of the color filter 230 instead of through the light blocking member 220.

A pixel electrode 191 is connected to the drain electrode 175 through the contact hole 181, and is on the first insulating layer 240. The pixel electrode 191 is in each pixel area P, and is connected to the drain electrode 175 thereby receiving the data signal from the drain electrode 175 when the thin film transistor is in the on state. The pixel electrode 191 may include a transparent metal material such as indium-tin oxide ("ITO") or indium-zinc oxide ("IZO"), but is not limited thereto or thereby.

The pixel electrode 191 includes a transverse stem 193, a longitudinal stem 192 crossing the transverse stem 193, and a plurality of first to fourth minute branches 194a, 194b, 194c and 194d.

The transverse stem 193 may have a longitudinal axis which extends in a direction parallel to the gate line 121, and the longitudinal stem 192 may have a longitudinal axis which extends in a direction parallel to the data line 171. The transverse stem 193 may be positioned at an approximate center between two neighboring gate lines 121, and the longitudinal stem 192 may be positioned at an approximate center between two neighboring data lines 171.

One pixel area P is divided into a first sub-pixel area, a second sub-pixel area, a third sub-pixel area and a fourth sub-pixel area by the transverse stem 193 and the longitudinal stem 192. The first sub-pixel area is positioned at the left side of the transverse stem 193 and at an upper side of the longitudinal stem 192, and the second sub-pixel area is positioned at the right side of the transverse stem 193 and at the upper side of the longitudinal stem 192. The third sub-pixel area is positioned at the left side of the transverse stem 193 and at a lower side of the longitudinal stem 192, and the fourth sub-pixel area is positioned at the right side of the transverse stem 193 and at the lower side of the longitudinal stem 192.

The first minute branches 194a are in the first sub-pixel area, and the second minute branches 194b are in the second sub-pixel area. The third minute branches 194c are in the third sub-pixel area, and the fourth minute branches 194d are in the fourth sub-pixel area.

The first minute branches 194a are obliquely extended from the transverse stem 193 or the longitudinal stem 192 in the left-upper direction, and the second minute branches 194b are obliquely extended from the transverse stem 193 or the longitudinal stem 192 in the right-upper direction. Also, the third minute branches 194c are obliquely extended from the transverse stem 193 or the longitudinal stem 192 in the left-lower direction, and the fourth minute branches 194d are obliquely extended from the transverse stem 193 or the longitudinal stem 192 in the right-lower direction.

The first to fourth minute branches 194a, 194b, 194c and 194d may form an angle of approximate 45 degrees or 135 degrees with the gate line 121 or the transverse stem 193. Also, the first to fourth minute branches 194a, 194b, 194c and 194d of neighboring sub-pixel areas form right angles with the respective minute branches.

A shape of the pixel electrode 191 shown in FIG. 1 has been described, however the shape of the pixel electrode 191 is not limited thereto, and various variations are possible. Also, one pixel area divided into four sub-pixel areas has been described, however one pixel area may be divided in any number of sub-pixel area or may not be divided into a plurality of sub-pixel areas.

A common electrode 270 separated from the pixel electrode 191 by a predetermined distance, is on the pixel electrode 191. A space 200 is formed between the pixel electrode 191 and the common electrode 270. The width of the space 200, taken perpendicular to the first and second directions, may be variously changed according to a resolution of the display device.

A liquid crystal 3 is filled in the space 200. The liquid crystal 3 includes a plurality of liquid crystal molecules, and the liquid crystal molecules may be aligned in a third direction which is perpendicular to the substrate 110, in the absence of an electric field. That is, vertical alignment may be realized. Also, alignment of liquid crystal molecules if is not limited to vertical alignment, and horizontal alignment may be realized.

The liquid crystal 3 may include one of nematic, smectic, cholesteric and chiral liquid crystal materials. Also, the liquid crystal 3 may include a negative liquid crystal material or a positive liquid crystal material.

In the above, the pixel electrode 191 is under the space 200 and the common electrode 270 is above the space 200, however the invention is not limited thereto. The pixel electrode 191 and the common electrode 270 may be both positioned under the space 200. In an exemplary embodiment, the pixel electrode 191 and the common electrode 270 may be formed from a same layer and/or may be in a same layer of the display device Alternatively, the pixel electrode 191 and the common electrode may be formed from different layers with an insulating layer interposed therebetween. In an exemplary embodiment, the liquid crystal 3 may be pre-tilted or slanted with respect to a direction parallel to the substrate 110, in the space 200, but the invention is not limited thereto or thereby.

A first alignment layer 11 is on the pixel electrode 191. The first alignment layer 11 may be on an exposed portion of the first insulating layer 240 that is not covered by the pixel electrode 191.

A second alignment layer 21 faces the first alignment layer 11 and is under the common electrode 270.

The first alignment layer 11 and the second alignment layer 21 may be vertical alignment layers and may include a material such as polyamic acid, polysiloxane or polyimide. The first and second alignment layers 11 and 21 may be connected to each other on the edge of the pixel area P, but are not limited thereto or thereby.

The space 200 is enclosed by the first insulating layer 240, the pixel electrode 191 and the common electrode 270. The common electrode 270 directly contacts the first insulating layer 240 at a portion of the pixel overlapping the data line 171. Thereby, the common electrode 270 covers and faces a right side surface and a left side surface of the space 200 in the portion of the pixel near the data line 171. Accordingly, the common electrode 270 is connected to the pixel areas neighboring in a row direction, e.g., the first direction. A column direction may be different from the row direction, e.g., the second direction.

The common electrode 270 is not in a portion of the pixel overlapping the gate line 121. Thereby, the common electrode 270 does not cover or overlap an upper surface and a lower surface of the space 200 in a portion of the pixel near the gate line 121. A liquid crystal injection hole 201 is at the portion of the pixel excluding the common electrode 270 near the gate line 121, such that the space 200 may be exposed to an outside, for example, at an upper surface and a lower surface of the space 200. That is, the liquid crystal injection hole 201 corresponds to the gate line 121, and the liquid crystal 3 is injected inside the space 200 through the liquid crystal injection hole 201.

In the above, the common electrode 270 covers the left side surface and the right side surface of the space 200 in a portion of the pixel near the gate line 121 and does not cover the upper surface and the lower surface of the space 200 in a portion of the pixel near the gate line 121, however the invention is not limited thereto. Alternatively, the common electrode 270 may cover another surface of the space 200. In one exemplary embodiment, for example, the common electrode 270 may cover the lower surface and the upper surface of the space 200 in a portion of the pixel near the gate line 121, and may not cover the right surface and the left surface of the space 200 in a portion of the pixel near the gate line 121. Where the common electrode 270 covers the lower surface and the upper surface of the space 200 in a portion of the pixel near the gate line 121, the liquid crystal injection hole 201 may correspond to the data line 171.

A second insulating layer 280 may be further on the common electrode 270. The second insulating layer 280 may include the inorganic insulating material such as silicon nitride (SiNx) or silicon oxide (SiOx), and may be omitted in an alternative exemplary embodiment if desired.

An roof layer 285 is on the second insulating layer 280. The roof layer 285 may include an organic material. The roof layer 285 covers a portion of the side surface and the upper surface of the space 200, thereby forming a boundary of the space 200 and maintaining a shape of the space 200.

A column 288 is on the roof layer 285 positioned on the boundary portion of the pixel area P. The column 288 protrudes from the roof layer 285 and overlaps the data line 171. The column 288 may have a relatively long and evenly shaped bar shape in the plan view. In an exemplary embodiment, the boundary of the pixel area P may be defined by the gate line 121 and the data line 171, but the invention is not limited thereto or thereby. Where the gate line 121 and the data line 171 define a boundary of the pixel area P, the column 288 overlaps adjacent data lines 171 that are at the right and left neighboring boundaries of the pixel area P.

Alternatively, the column 288 may overlap the gate line 121. Alternatively, the column may have a lattice shape in the plan view to overlap the gate line 121 and the data line 171.

In a cross-sectional view, side surfaces of the column 288 are tapered, and a taper angle with respect to the substrate 110 may be more than about 10 degrees.

Referring to FIG. 4, the plurality of pixel areas P is disposed in a matrix shape in the plan view, and the roof layer 285 is continuous and connected corresponding to the pixel areas P neighboring in the row direction. The column 288 overlaps the roof layer 285 and corresponds to the boundary portion between the pixel areas P neighboring in the row direction. As illustrated in FIG. 4, the column 288 is in the boundary portion of the pixel areas P of a first row of pixel areas P, and the column 288 is in the boundary portion of the pixel areas P of a second row and a third row of pixel areas P. That is, the column 288 corresponds to the boundary portion dividing a first column of pixel areas P and a second column of pixel areas P, and the column 288 corresponds to the boundary portion dividing the second column of pixel areas P and a third column of pixel areas P.

In an alternative exemplary embodiment of the invention the column 288 in the boundary portion of the first row of pixel areas P may be connected to the column 288 in the boundary portion of the second row of pixel areas P. Likewise, the column 288 in the boundary portion of the second row of pixel areas P may be connected to the column 288 in the boundary portion of the third row of pixel areas P.

The column 288 may be integrally formed with the roof layer 285, such that the column 288 and the roof layer 285 form a single, unitary, indivisible unit. The column 288 may include a same material as the roof layer 285 and/or be formed with a same process. That is, the column 288 and the roof layer 285 may be formed with a same layer or material of the display device and/or may be in a same layer of the display device. The integral roof layer 285 may include a first portion having a first height with respect to a common reference point and a second portion having a second height smaller than the first height. The first portion may on the boundary portion between adjacent pixel areas P and the second portion may be in the pixel area P. The second portion of the roof layer 285 may have a substantially planar or flat upper surface.

A thickness of the column 288 may be more than about 2 microns (um). The column 288 and the roof layer 285 may include a material having a compression change amount of less than 50%.

Since the space 200 is under the roof layer 285 in the pixel area P, the roof layer 285 may be collapsed if a force is applied on the roof layer 285. In one or more exemplary embodiments of the invention, the column 288 is on the boundary portion of the pixel area P where the space 200 is not formed such that a force applied to a display device from the outside is transmitted to the column 288, and thereby the space 200 is maintained and the roof layer 285 is not collapsed.

A third insulating layer 290 may be further on the roof layer 285 and the column 288. The third insulating layer 290 may include the inorganic insulating material such as silicon nitride (SiNx) or silicon oxide (SiOx). The third insulating layer 290 may cover the upper surface and the side surface of the roof layer 285. The third insulating layer 290 has a function of protecting the roof layer 285 including the organic material, and may be omitted in an alternative exemplary embodiment if desired.

An overcoat 295 may be on the third insulating layer 290. The overcoat 295 covers the liquid crystal injection hole 201 where the space 200 is exposed to the outside. That is, the overcoat 295 may seal the liquid crystal injection hole 201 such that the liquid crystal 3 inside the space 200 does not flow outside the space 200. Since the overcoat 295 may contacted the liquid crystal 3 at the liquid crystal injection hole 201, the overcoat 295 may not include a material that reacts with the liquid crystal 3. In one exemplary embodiment, for example, the overcoat 295 may include a material such as parylene.

A first polarizer 12 may be under the substrate 110 and a second polarizer 22 may be further on the overcoat 295.

When the second polarizer 22 is on the overcoat 295, the second polarizer 22 may flattens or planarize the upper portion of the overcoat 295. In an alternative exemplary embodiment, a further roof layer 295' flattening the upper portion of the overcoat 295 may be between the second polarizer 22 and the overcoat 295. In another alternative embodiment, an overcoat layer may collectively include layers 295 and 295' to be a relatively thick roof layer having a planar upper surface, to flatten the substrate 110.

The color filter 230 is in the pixel area P and the light blocking member 220 is on the boundary of the pixel area P, however, the invention is not limited thereto. Alternatively, the light blocking member 220 may be excluded. Instead of the light blocking member 220, a color filter 230 in the pixel area P may be extended to the boundary portion of the pixel area P such that two color filters 230 of two colors overlap. The color filters 230 on the boundary portion of the pixel area P and overlapping each other may have a function of blocking light.

The color filter 230 and the light blocking member 220 are under the common electrode 270, however, the invention is not limited thereto.

Alternatively, the color filter 230 and the light blocking member 220 may be above the common electrode 270. When the color filter 230 and the light blocking member 220 are above the common electrode 270, the roof layer 285 may be omitted, and the color filter 230 and the light blocking member 220 may have the function of the roof layer 285.

As discussed above, the color filter layer 230 in the pixel area P may be extended to the boundary portion of the pixel area P such that two color filters 230 of two colors overlap. The two color filters 230 on the boundary portion of the pixel area P and overlapping each other may have a function of blocking light. Also, a portion of the color filters 230 overlapped on the boundary portion of the pixel area P has a thickness larger than a portion of the color filter 230 in the pixel area, thereby functioning as the column 288. Accordingly, it may not be necessary to include the additional light blocking member and the column.

Next, another exemplary embodiment of a display device according to the invention will be described with reference to FIG. 5 and FIG. 6.

Figure 5:
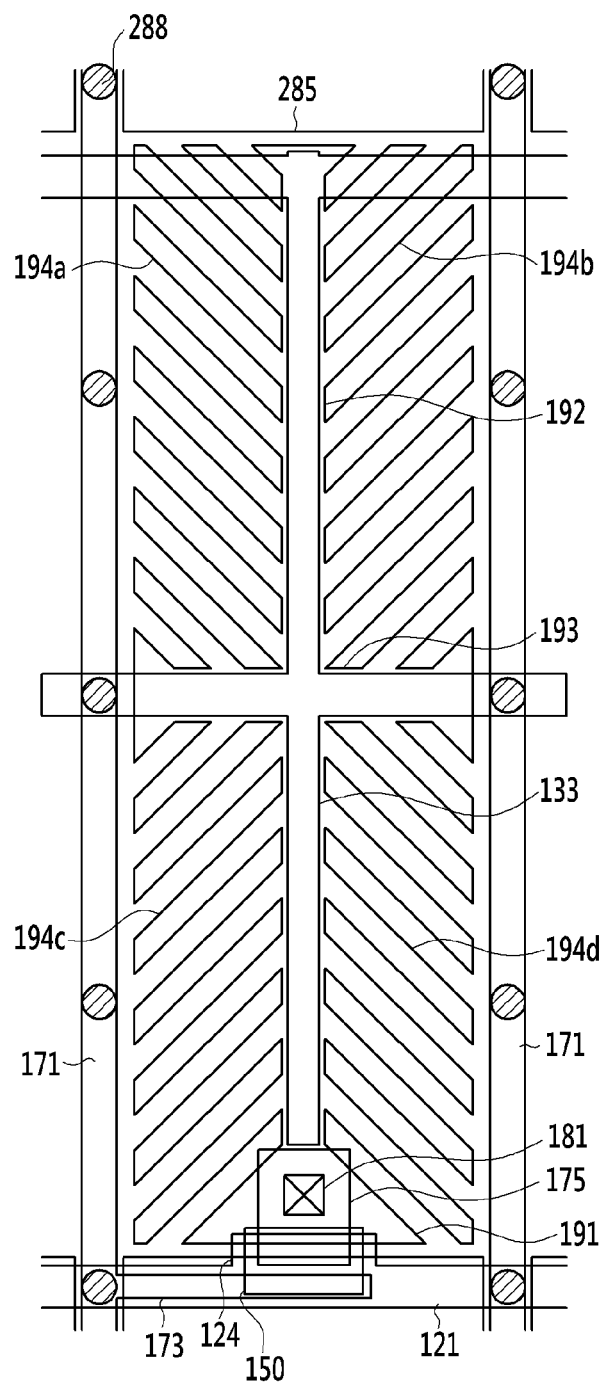
FIG. 5 is a top plan view of another exemplary embodiment of one pixel of a display device according to the invention.
Figure 6:
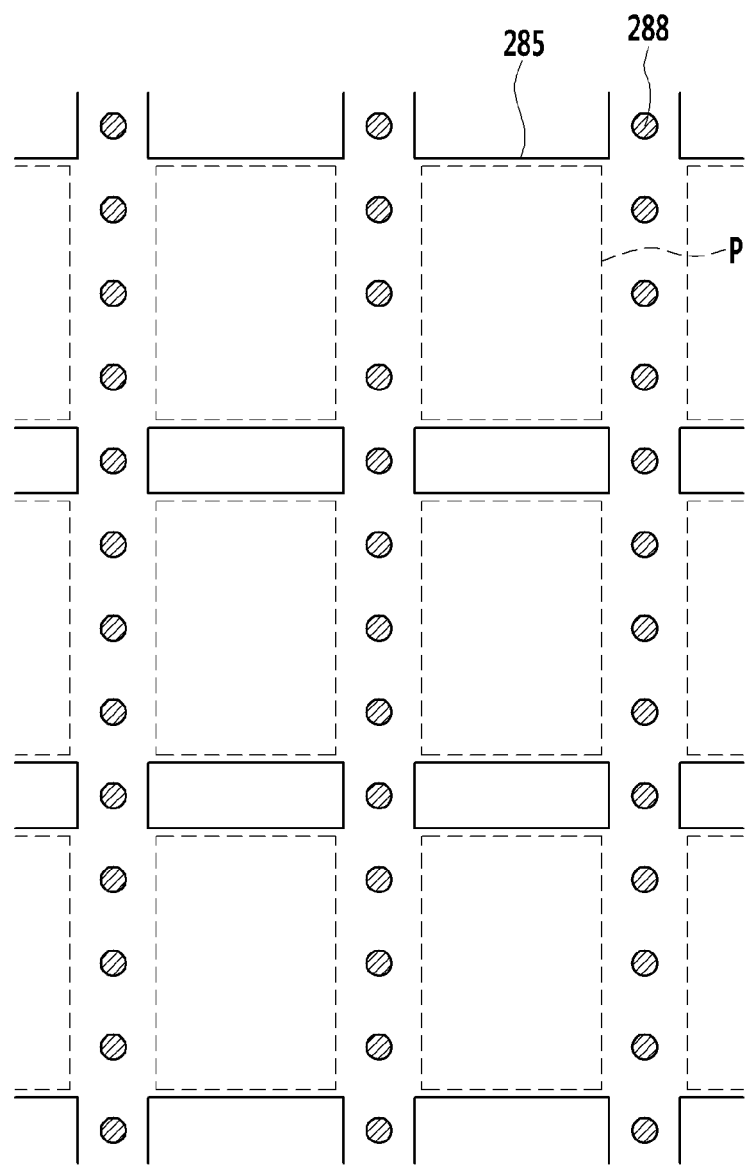
FIG. 6 is a top plan view of another exemplary embodiment of a plurality of pixels of a display device according to the invention.

The exemplary embodiment of a display device in FIG. 5 and FIG. 6 is substantially the same as the display device in FIG. 1 to FIG. 4 such that a complete description thereof is omitted and differences will be hereinafter described. The largest difference between the exemplary embodiment of the display device in FIG. 5 and FIG. 6 and that of FIG. 1 to FIG. 4 is a shape of the column, and this will be described hereafter.

FIG. 5 is a top plan view of another exemplary embodiment of one pixel of a display device according to the invention, and FIG. 6 is a top plan view of another exemplary embodiment of a plurality of pixels of a display device according to the invention.

The constituent elements of the display device in FIG. 5 and FIG. 6 are in a substantially same sequence as in the display device in FIG. 1 to FIG. 4.

In FIG. 1 to FIG. 4, the column 288 is connected corresponding to the boundary portion dividing the pixel areas P neighboring in the row direction and has the bar shape in the plan view. In contrast, the column 288 in FIG. 5 and FIG. 6 has a discrete shape, such as a circular shape in the plan view. That is, since the shape of the column 288 is circular in the plan view, the shape of the column 288 is a circular cylinder in a perspective view. The display device may include a plurality of discrete columns 288.

The shape of the column 288 is not limit thereto, and may have any of a number of various shapes such as a quadrangular column shape.

A plurality of columns 288 is separated by a predetermined interval along the boundary portion dividing the pixel areas P neighboring in the row direction. In one exemplary embodiment, one column 288 is at a position where the gate line 121 and the data line 171 are crossed, and three columns 288 are between two neighboring crossing positions.

However, the invention is not limited thereto and the plurality of columns 288 may be separated with non-uniform intervals, and the number of columns 288 between two neighboring crossing positions may be variously changed.

Next, another exemplary embodiment of a display device according to the invention will be described with reference to FIG. 7 and FIG. 8.

Figure 7:
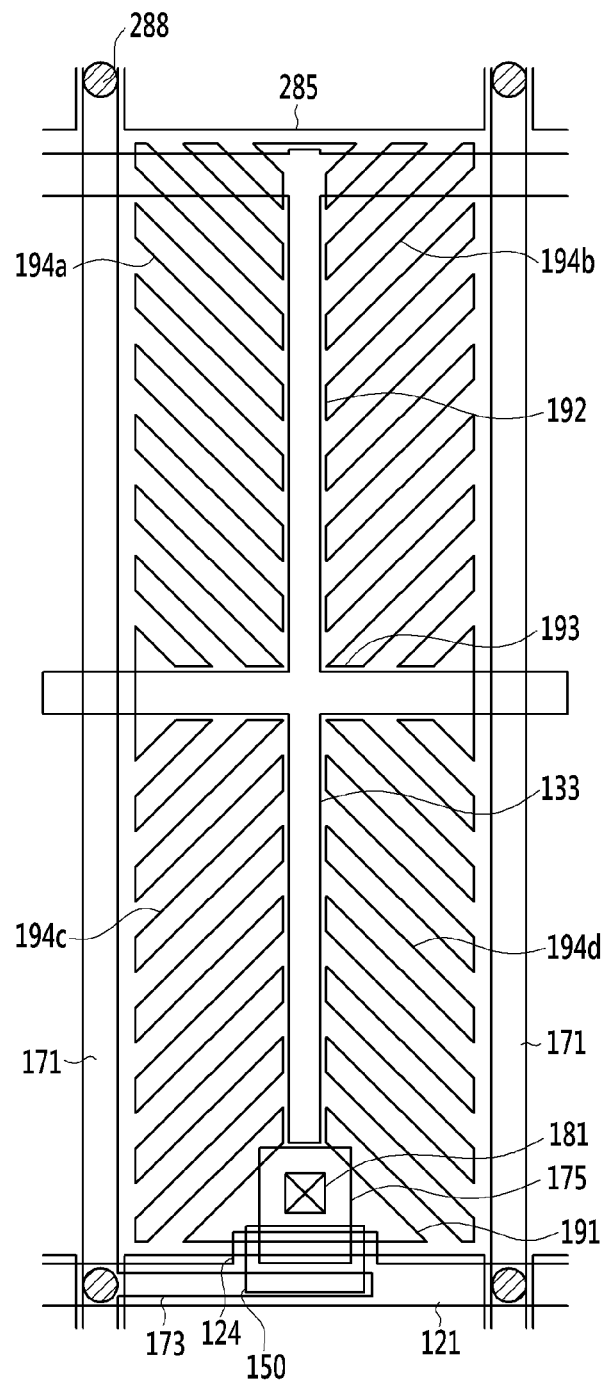
FIG. 7 is a top plan view of another exemplary embodiment of one pixel of a display device according to the invention.
Figure 8:
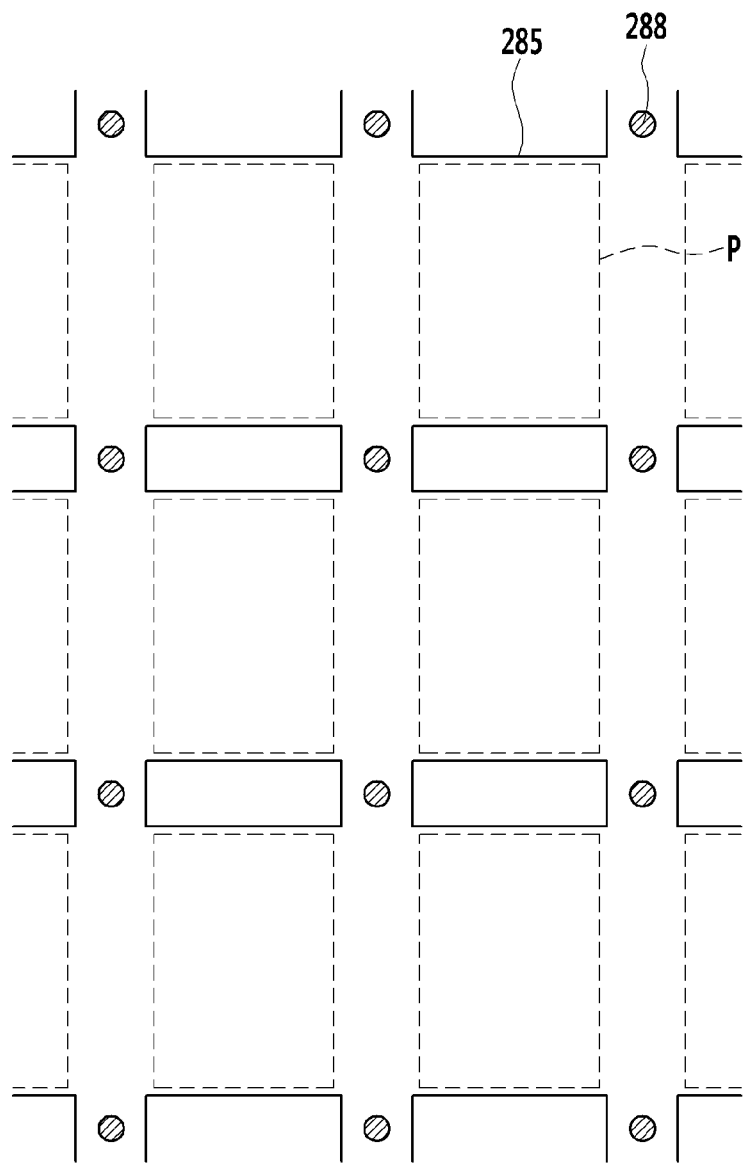
FIG. 8 is a top plan view of another exemplary embodiment of a plurality of pixels of a display device according to the invention.

The exemplary embodiment of a display device in FIG. 7 and FIG. 8 is substantially the same as the display device in FIG. 5 and FIG. 6 such that the complete description thereof is omitted and differences will be hereinafter described. The largest difference between the exemplary embodiment of the display device in FIG. 7 and FIG. 8 and that of FIG. 1 to FIG. 4 is a position of the column, and this will be described in detail hereafter.

FIG. 7 is a top plan view of another exemplary embodiment of one pixel of a display device according to the invention, and FIG. 8 is a top plan view of another exemplary embodiment of a plurality of pixels of a display device according to the invention.

The constituent elements of the display device in FIG. 7 and FIG. 8 are in a same sequence as the display device in FIG. 5 and FIG. 6.

In FIG. 5 and FIG. 6, the column 288 is at the crossing position of the gate line 121 and the data line 171 and between two neighboring crossing positions. In contrast, the column 288 in FIG. 7 and FIG. 8 is only at the crossing position of the gate line 121 and the data line 171. That is, in the exemplary embodiment shown in FIG. 7 and FIG. 8, the column 288 is not between two neighboring crossing positions.

The shape of the column 288 in FIG. 7 and FIG. 8 may be circular cylinder like in FIG. 5 and FIG. 5, but is not limited thereto or thereby.

In FIG. 7 and FIG. 8, the column 288 may be at all crossing positions of the gate line 121 and the data line 171, however the invention is not limited thereto. In one exemplary embodiment, one column 288 may be disposed per two crossing positions of the gate line 121 and the data line 171. Alternatively, one column 288 may be disposed per three or more crossing positions.

Next, another exemplary embodiment of a display device according to the invention will be described with reference to FIG. 9 and FIG. 10.

Figure 9:
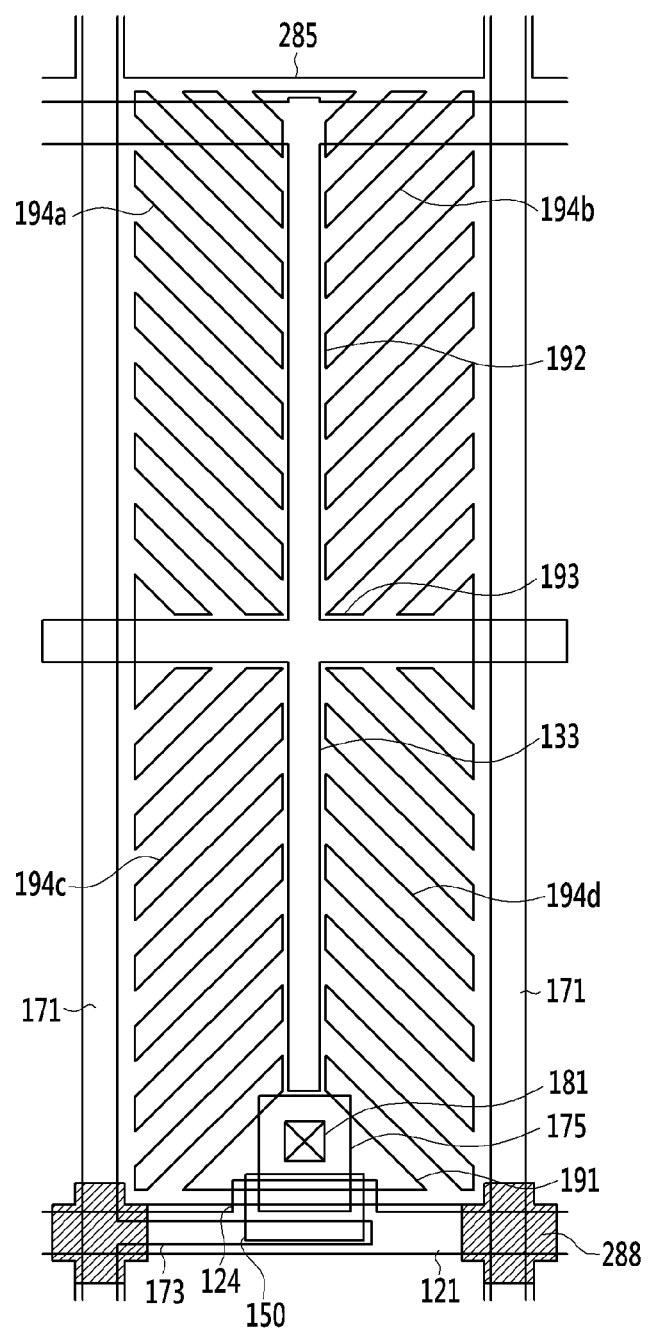
FIG. 9 is a top plan view of another exemplary embodiment of a one pixel of a display device according to the invention.
Figure 10:
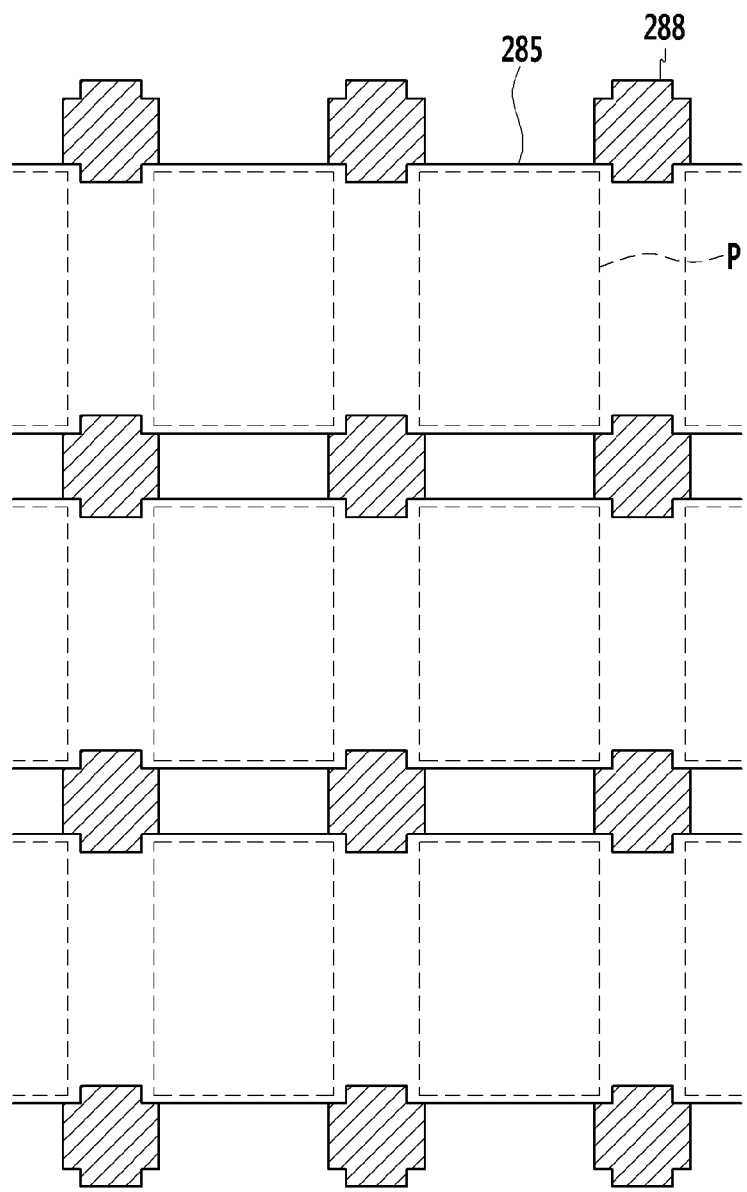
FIG. 10 is a top plan view of another exemplary embodiment of a plurality of pixels of a display device according to the invention.

The exemplary embodiment of a display device in FIG. 9 and FIG. 10 is substantially the same as the display device in FIG. 7 and FIG. 8 such that the complete description thereof is omitted and differences will be hereinafter described. The largest difference between the exemplary embodiment of the display device in FIG. 9 and FIG. 10 and that of FIG. 7 and FIG. 8 is a shape the column and this will be described hereafter.

FIG. 9 is a top plan view of another exemplary embodiment of one pixel of a display device according to the invention, and FIG. 10 is a top plan view of another exemplary embodiment of a plurality of pixels of a display device according to the invention.

The constituent elements of the display device in FIG. 9 and FIG. 10 are in a same sequence as for the display device in FIG. 7 and FIG. 8.

In FIG. 7 and FIG. 8, the shape of the column 288 is circular in the plan view. In contrast, the shape of the column 288 in FIG. 9 and FIG. 10 is a cross shape in the plan view.

The column 288 is at a position at which the gate line 121 and the data line 171 are crossed, similar to that in FIG. 7 and FIG. 8.

That is, the column 288 has the cross shape at the crossing position of the gate line 121 and the data line 171.

Next, an exemplary embodiment of a manufacturing method of a display device according to the invention will be described with reference to FIG. 11 to FIG. 26.

An exemplary embodiment of a manufacturing method of a display device relates to a method of manufacturing the display device in FIG. 1 to FIG. 4, and the display devices in FIG. 5 to FIG. 10 may be manufactured by slightly changing a shape of a mask and using substantially a same method.

FIG. 11 to FIG. 26 are cross-sectional views of an exemplary embodiment of a manufacturing method of a display device according to the invention. FIG. 11, FIG. 13, FIG. 15, FIG. 17, FIG. 19, FIG. 21, FIG. 23 and FIG. 25 are cross-sectional views taken along the same line, for example, line II-II in FIG. 1. Also, FIG. 12, FIG. 14, FIG. 16, FIG. 18, FIG. 20, FIG. 22, FIG. 24 and FIG. 26 are cross-sectional views taken along the same line, for example, line III-III in FIG. 1.

Figure 11:
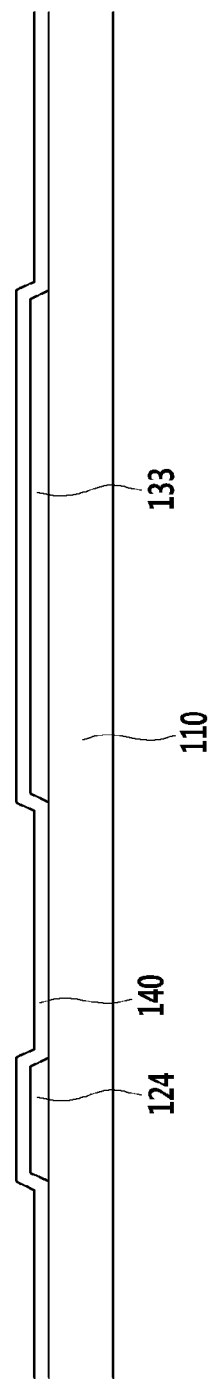
FIG. 11 to FIG. 26 are cross-sectional views of an exemplary embodiment of a manufacturing method of a display device according to the invention.
Figure 12:
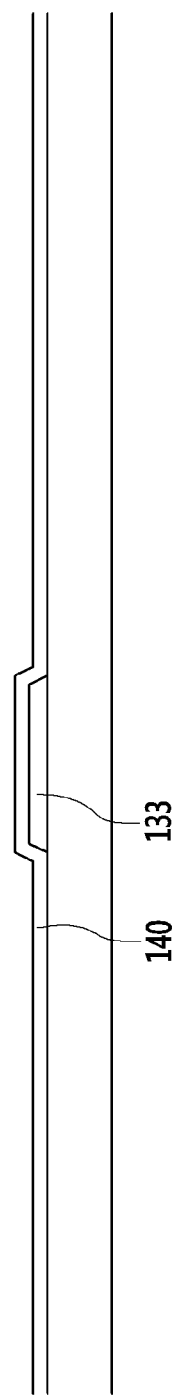

Firstly, as shown in FIG. 11 and FIG. 12, a gate line 121 (not shown) extending in a first direction, and a gate electrode 124 protruded from the gate line 121, are formed on a substrate 110. The substrate 110 may include glass or plastic, but is not limited thereto or thereby. Also, a storage electrode 133 separated from the gate line 121 and the gate electrode 124 is formed. The storage electrode 133 may be formed with the same material as the gate line 121 and the gate electrode 124, and/or may be in the same layer of the display device as the gate line 121 and the gate electrode 124.

A gate insulating layer 140 including an inorganic insulating material such as silicon oxide or silicon nitride, is formed on an entire surface of the substrate 110 including the gate line 121, the gate electrode 124 and the storage electrode 133. The gate insulating layer 140 may be formed with a single layer structure or a multilayer structure.

Figure 13:
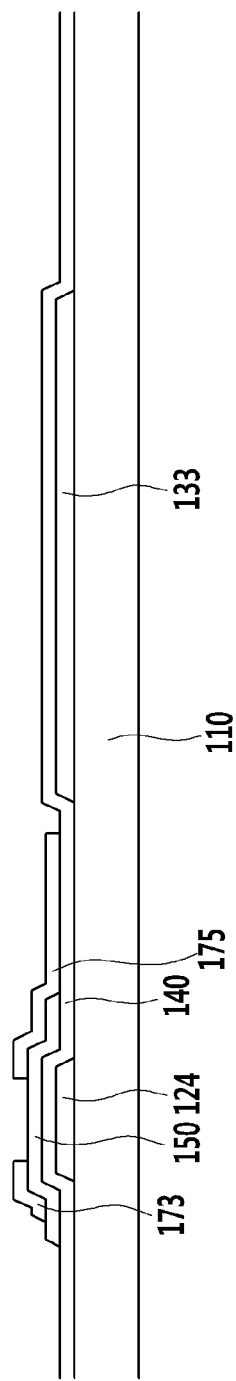
Figure 14:
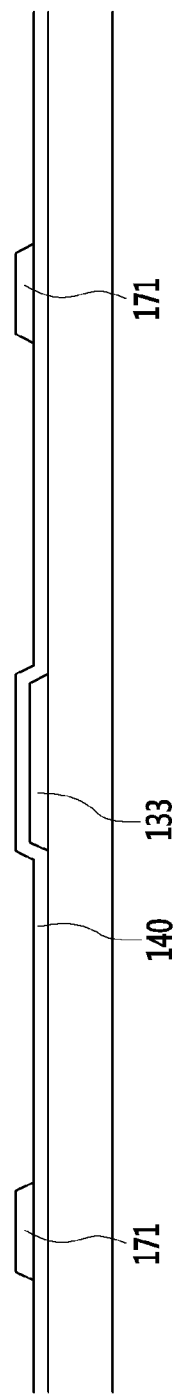

As shown in FIG. 13 and FIG. 14, a semiconductor material such as amorphous silicon, polycrystalline silicon or a metal oxide is deposited on the gate insulating layer 140 and patterned to form a semiconductor layer 150. The semiconductor layer 150 may be formed to be positioned on and overlapping the gate electrode 124.

A metal material is deposited and patterned to form a data line 171 extending in a second direction different from the first direction. Also, a source electrode 173 protruded from the data line 171 and a drain electrode 175 separated from the source electrode 173, are formed on the semiconductor layer 150. The metal material may have a single layer structure or a multilayer structure.

In an exemplary embodiment, the semiconductor material and the metal material may be continuously deposited and simultaneously patterned to form the semiconductor layer 150, the data line 171 the source electrode 173, and the drain electrode 175. The semiconductor layer 150 may be extended under the data line 171.

The gate electrode 124, the semiconductor layer 150, the source electrode 173 and the drain electrode 175 form one thin film transistor. The gate line 121 and the data line 171 may be formed to cross each other. In one exemplary embodiment, a plurality of pixel areas P may be defined by crossed gate lines 121 and data lines 171, but the invention is not limited thereto or thereby.

Figure 15:
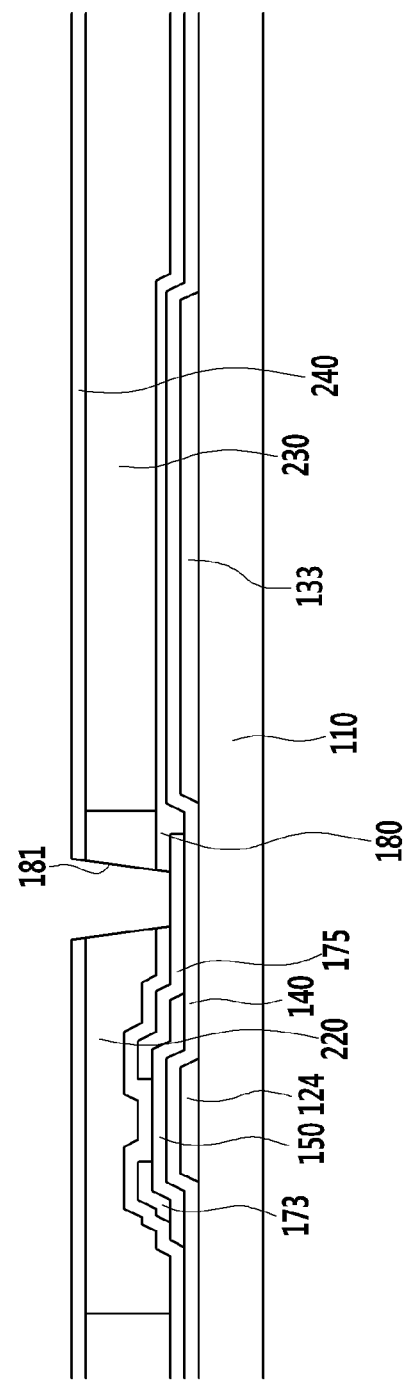
Figure 16:
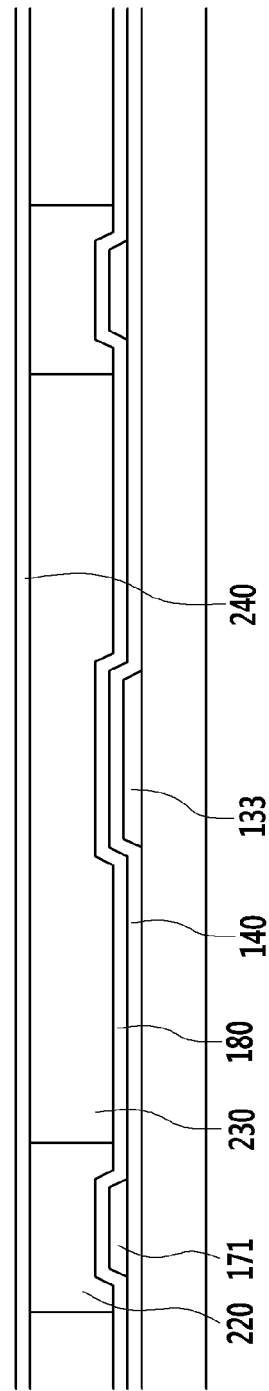

As shown in FIG. 15 and as FIG. 16, a passivation layer 180 is formed on the data line 171, the source electrode 173, the drain electrode 175 and a portion of the semiconductor layer 150 exposed between the source electrode 173 and the drain electrode 173. The passivation layer 180 may include the organic insulating material or the inorganic insulating material, and may be formed in the single layer structure or the multilayer structure.

A color filter 230 is formed in each pixel area P and on the passivation layer 180. Color filters 230 of a same color may be formed according to a column direction of a plurality of pixel areas P. In one exemplary embodiment, for example, when forming the color filter 230 of three colors, the color filter 230 of the first color is formed at a first position and then the color filter 230 of the second color is formed in a second position different than the first position, such as by shifting a mask. After forming the color filter 230 of the second color in the second position, the color filter 230 of the third color may be formed in a third position, such as by shifting the mask.

A light blocking member 220 is formed on the thin film transistor and the boundary portion of the pixel areas on the passivation layer 180.

While it is described that after forming the color filter 230, the light blocking member 220 is formed, the invention is not limited thereto. Alternatively, the color filter 230 may be formed after forming the light blocking member 220.

The first insulating layer 240 including the inorganic insulating material such as silicon nitride (SiNx) or silicon oxide (SiOx) is formed on the color filter 230 and the light blocking member 220.

The first insulating layer 240, the light blocking member 220 and the passivation layer 180 are etched to form a contact hole 181 exposing a portion of the drain electrode 175.

Figure 17:
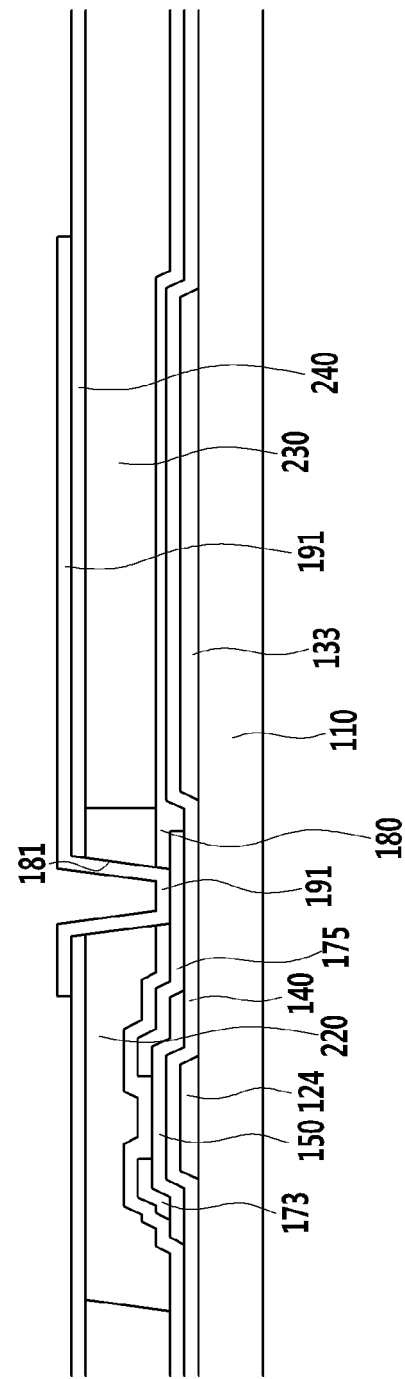
Figure 18:
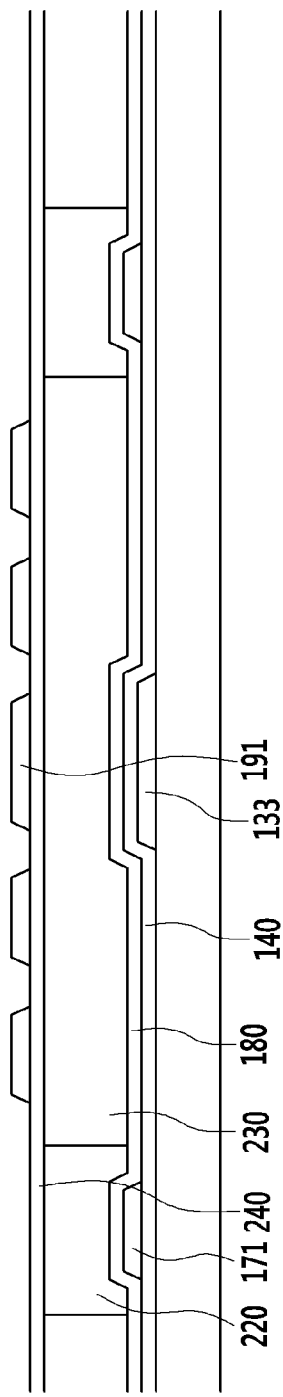

As shown in FIG. 17 and FIG. 18, a transparent metal material such as indium-tin oxide ("ITO") or indium-zinc oxide ("IZO") is deposited and patterned on the first insulating layer 240 to form a pixel electrode 191 in the pixel area P. The pixel electrode 191 is connected to the drain electrode 175 through the contact hole 181.

Figure 19:
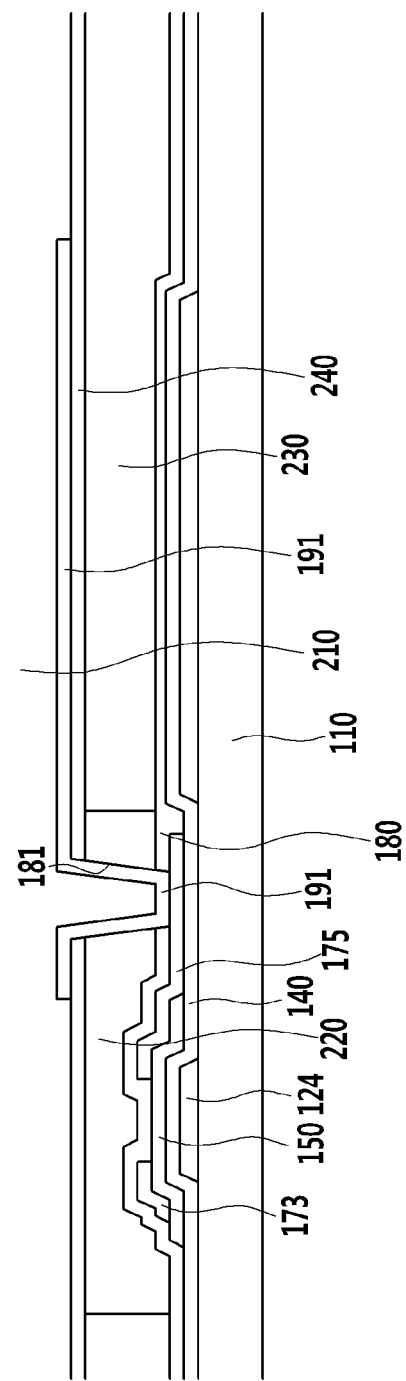
Figure 20:
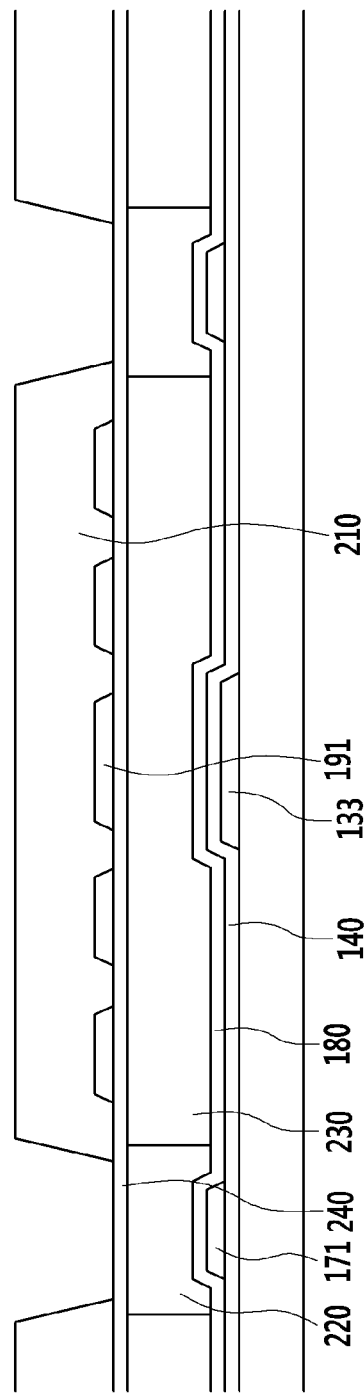

As shown in FIG. 19 and FIG. 20, a sacrificial layer 210 including the organic insulating material is formed on the pixel electrode 191 and the first insulating layer 240. The sacrificial layer 210 is patterning to be divided between the pixel areas P in a first direction (refer to FIG. 20) and to be connected in neighboring pixel areas P neighboring in a second direction different from the first direction (refer to FIG. 19). In one exemplary embodiment, for example, the sacrificial layer 210 may be separated between the pixel areas P neighboring in the row direction and may be connected according to the pixel areas P neighboring in the column direction. If the sacrificial layer 210 is initially formed on the date line 171, the sacrificial layer 210 formed on the data line 171 may be subsequently removed so that the sacrificial layer 210 is divided between the pixel areas P.

The sacrificial layer 210 may include a photosensitive polymer material, and the sacrificial layer 210 may be patterned by performing a photo-process.

Figure 21:
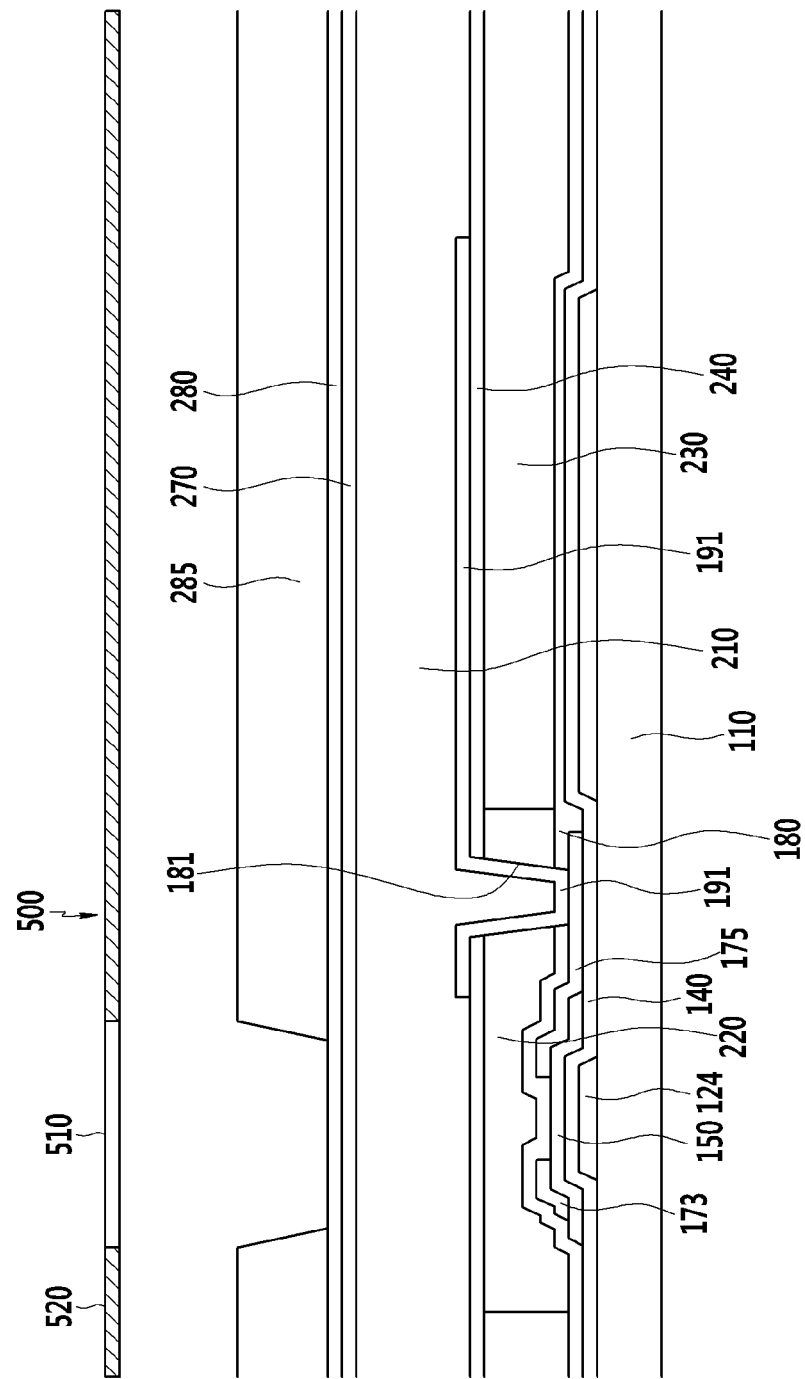
Figure 22:
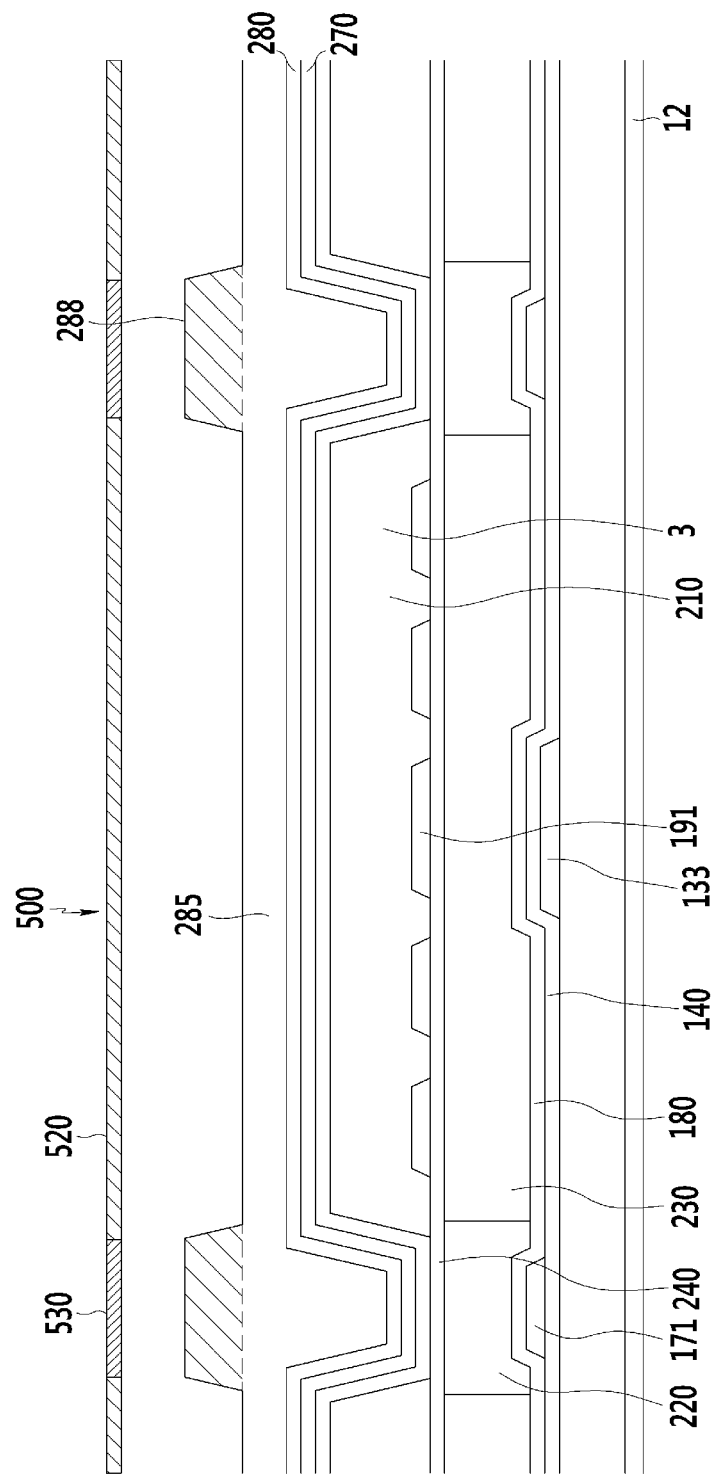

As shown in FIG. 21 and FIG. 22, a metal material is deposited on the sacrificial layer 210 to form a common electrode 270.

The second insulating layer 280 including the inorganic insulating material such as silicon oxide or silicon nitride is formed on the common electrode 270.

The roof layer 285 including the organic material is formed on the second insulating layer 280. The roof layer 285 is patterned to remove the portion of the roof layer 285 overlapping the gate line 121 and to reduce the thickness of the roof layer 285 positioned in the pixel area.

A mask 500 for the patterning of the roof layer 285 may be a half-tone mask or a slit mask. The mask 500 includes a transmitting part 510, a semi-transmitting part 520 and a non-transmitting part 530. The transmitting part 510 of the mask 500 transmits most of the light, the semi-transmitting part 520 is formed of a slit for about half of light to be transmitted and the non-transmitting part 530 is formed for light not to be transmitted.

The transmitting part 510 corresponds to the portion of the gate line 121, the semi-transmitting part 520 corresponds to the pixel area, and the non-transmitting part 530 corresponds to the data line 171. The mask 500 is positioned on the substrate 110 and an exposure and developing process is performed such that the roof layer 285 is formed to have different thicknesses.

The roof layer 285 partially encloses the upper surface and the side surface of the sacrificial layer 210. Referring to FIG. 22, the roof layer 285 overlaps an upper surface of the sacrificial layer 210 and a portion of the side surface of the sacrificial layer. The roof layer 285 on the gate line 121 is removed such that the roof layer 285 encloses the upper surface, the left side surface, and the right side surface of the sacrificial layer 210.

The roof layer 285 positioned on the data line 171 has a larger thickness than the roof layer 285 positioned in the pixel area P, such that the roof layer 285 positioned on the data line 171 is protruded, and this protruded portion forms the column 288. That is, the roof layer 285 and the column 288 are formed in a same process and/or from a same material, thereby being integrally formed as a single, unitary indivisible member.

The roof layer 285 and the column 288 are formed in the same process, however, the invention is not limited thereto. The roof layer 285 and the column 288 may be formed through separate processes. In one exemplary embodiment, for example, after firstly forming the roof layer 285, the roof layer 285 corresponding to the portion of the gate line 121 is removed, and then another material is deposited and patterned on the roof layer 285 to form the column 288.

Both side surfaces of the column 288 are formed to be tapered in a cross-sectional view. A taper angle may be more than about 10 degrees.

The thickness of the column 288 in a third direction orthogonal to the first and second directions, may be more than about 2 um. The column 288 and the roof layer 285 may include a material having a compression change amount of less than 50%.

Figure 23:
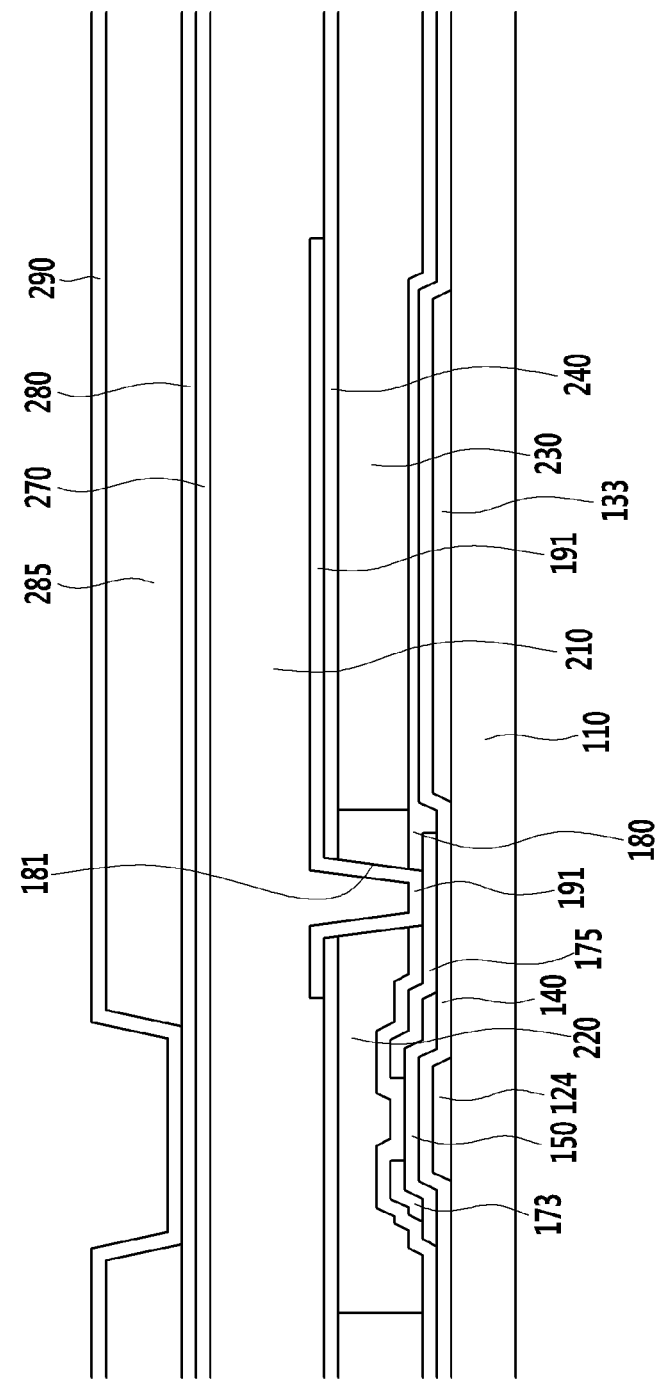
Figure 24:
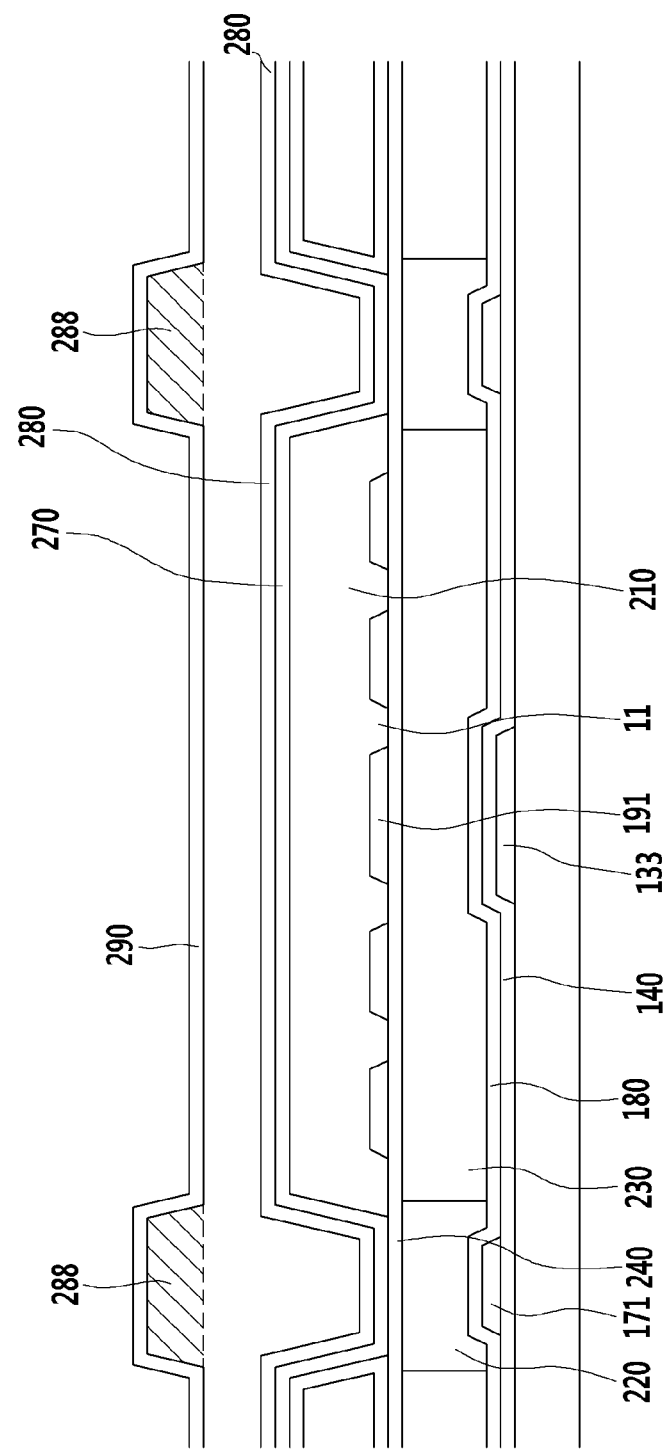

As shown in FIG. 23 and FIG. 24, the third insulating layer 290 including the inorganic insulating material such as silicon nitride (SiNx) or silicon oxide (SiOx) may be formed on the roof layer 285.

Figure 25:
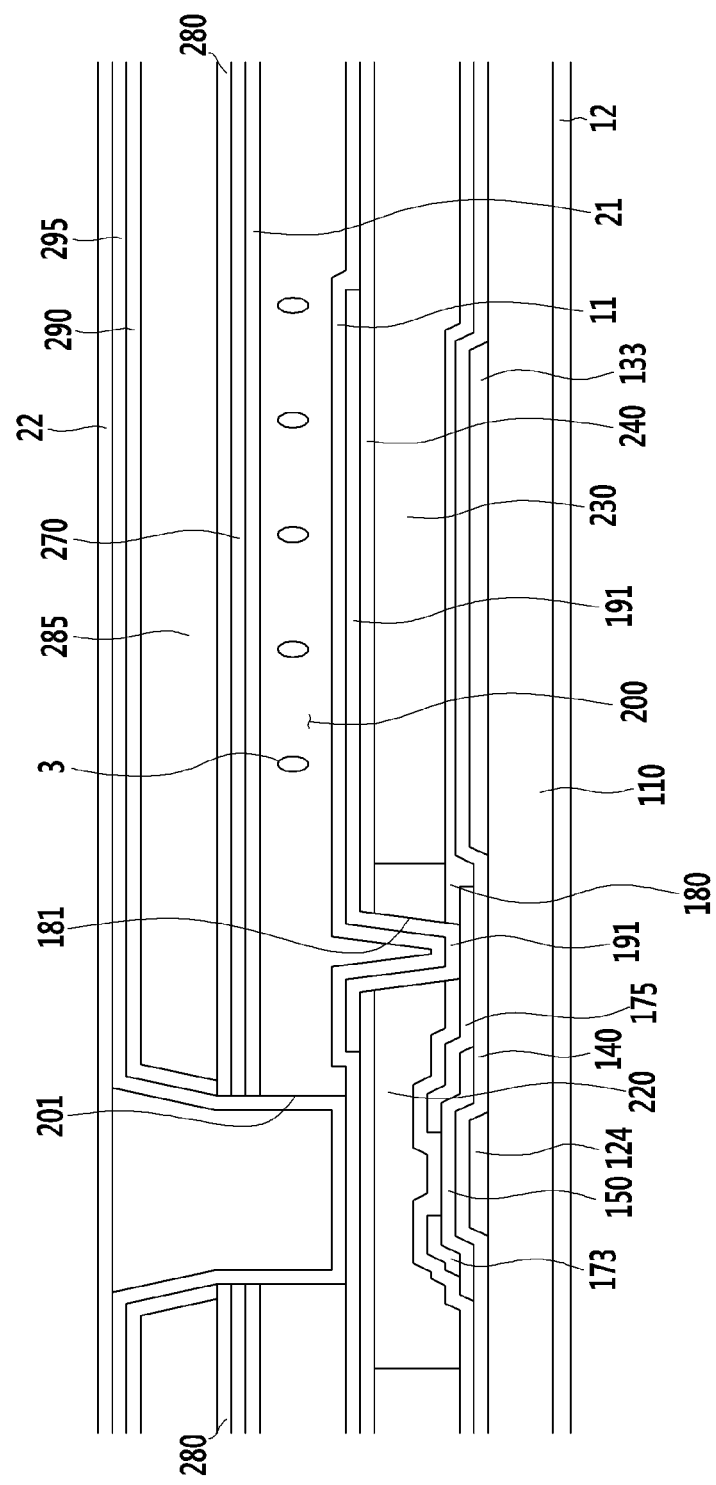
Figure 26:
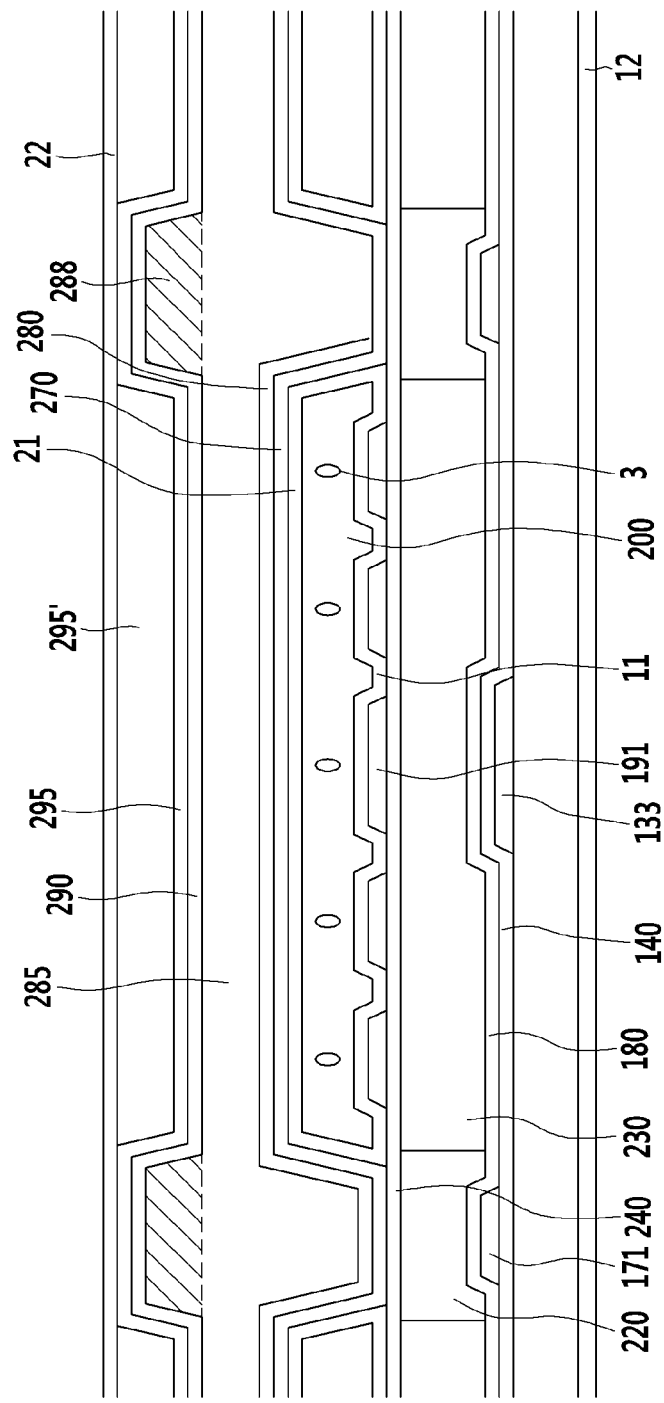

As shown in FIG. 25 and FIG. 26, the third insulating layer 290, the second insulating layer 280, and the common electrode 270 are patterned to remove the third insulating layer 290, the second insulating layer 280 and the common electrode 270 overlapping the gate line 121. By removing a portion of the common electrode 270 overlapping the gate line 121, a portion of the sacrificial layer 210 positioned under the removed portion of the common electrode 270 is exposed.

An entire of the sacrificial layer 210 is removed, such as by supplying oxygen plasma for ashing to the substrate 110 where the sacrificial layer 210 is exposed, or by supplying a developing solution. By removing the sacrificial layer 210, a space 200 is generated at a position where the sacrificial layer 210 was previously positioned. That is, the pixel electrode 191 and the common electrode 270 are separated with the space 200 interposed therebetween.

Also, the space 200 is exposed to an outside through a portion where the common electrode 270 is not formed. The portion where an inner area of the space 200 is exposed is otherwise referred to as a liquid crystal injection hole 201. The liquid crystal injection hole 201 may have a longitudinal axis formed according to the direction of the gate line 121, for example, parallel with the gate line 121. Alternatively, the liquid crystal injection hole 201 may have a longitudinal axis formed according to the data line 171, for example, parallel with the data line 171.

An aligning agent including an alignment material is deposited on the substrate 110 by a spin coating method or an inkjet method to inject the aligning agent inside the space 200 through the liquid crystal injection hole 201. After injecting the aligning agent inside the space 200, a hardening process is performed to evaporate a solution component such that the alignment material remains on an inner wall of the space 200.

Accordingly, the first alignment layer 11 may be formed in the space 200 and on the pixel electrode 191, and the second alignment layer 21 may be formed under the common electrode 270. The first alignment layer 11 and the second alignment layer 21 are formed on upper and lower inner walls of the space 200 to face to each other via the space 200, and are formed on side inner walls of the space 200 to be connected to each other at the edge of the pixel area P. That is, the common electrode 270 forms a side wall covering the side surface of the space 200 in the direction parallel to the data line 171 in the portion near the data line 171 before the alignment layers 11 and 21 are formed, and the alignment material remains on the inner surface of the side wall formed by the common electrode 270.

The first and second alignment layers 11 and 21 are configured to perform an alignment in the direction perpendicular to the first substrate 110 except for the side surface of the space 200. In additional, by performing a process of irradiating ultraviolet rays to the first and second alignment layers 11 and 21, the alignment may be performed in the direction parallel to the substrate 110 such as to provide a pretilt.

Liquid crystal 3 including liquid crystal molecules are provided in the space 200, such as by dropping the liquid crystal 3 by an inkjet method or by a dispensing method on the substrate 110 such that the liquid crystal 3 is injected inside the space 200 through the liquid crystal injection hole 201. In one exemplary embodiment, at this portion of the method of manufacturing, the liquid crystal 3 may be dropped to the liquid crystal injection holes 201 formed according to the odd-numbered gate lines 121, and may not be dropped to the liquid crystal injection holes 201 formed according to the even-numbered gate lines 121. In an alternative exemplary embodiment, the liquid crystal 3 may be dropped to the liquid crystal injection holes 201 formed according to the even-numbered gate lines 121, and may not be dropped to the liquid crystal injection holes 201 formed according to the odd-numbered gate lines 121.

If the liquid crystal 3 is dropped to the liquid crystal injection holes 201 formed according to the odd-numbered gate lines 121, the liquid crystal 3 is injected inside the space 200 through the liquid crystal injection holes 201 by capillary force. By the capillary force, air inside the space 200 flows out through the liquid crystal injection holes 201 formed according to the even-numbered gate lines 121, and thereby the liquid crystal 3 is easily injected inside the space 200.

A material that does not react with the liquid crystal 3 is deposited on the second insulating layer 290 to form an overcoat 295. The overcoat 295 is formed to cover the liquid crystal injection holes 201 where the space 200 is exposed outside and to seal the space 200 for each pixel area P. In one exemplary embodiment, for example, the overcoat 295 may include the material that does not react with the liquid crystal 3, such as parylene.

A further organic insulating layer 295' flattening the upper portion of the overcoat 295 may be between a second polarizer 22 and the overcoat 295. In an alternative embodiment, an overcoat layer may collectively include layers 295 and 295' to be a relatively thick organic layer having a planar upper surface, to flatten the substrate 110.

The overcoat 295 may be formed by dropping and hardening the material that does not react with the liquid crystal 3 by the inkjet method on the third insulating layer 290.

Also, the overcoat 295 may be formed by adhering a material with a film shape on the third insulating layer 290.

A first polarizer 12 may be formed under the substrate 110 and the second polarizer 22 may be formed on the overcoat 295.

A description of a process of forming the second polarizer 22 on the overcoat 295 is omitted for convenience. The second polarizer 22 may be attached after flattening the upper portion of the overcoat 295.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate;
   a thin film transistor on the substrate;
   a pixel electrode on the substrate and connected to the thin film transistor;
   a common electrode which is on the pixel electrode and extends towards the substrate to define a plurality of spaces between the common and pixel electrodes in which liquid crystal is disposed, wherein the plurality of spaces are separated from each other by the extended common electrode;
   a roof layer disposed on the common electrode and comprising a transparent organic material;
   an overcoat which is disposed on the roof layer, and comprising an organic material;
   a first protruding portion protruded from a lower surface of the roof layer toward the substrate; and
   a second protruding portion protruded from an upper surface of the roof layer toward the overcoat,
   wherein the second protruding portion is disposed between a first portion of the overcoat disposed on a space of the plurality of spaces and a second portion of the overcoat disposed on another space of the plurality of spaces.

2. The display device of claim 1, wherein
   the second protruding portion is continuous with the roof layer.

3. The display device of claim 1, wherein
   the second protruding portion is bar-shaped in a plan view.

4. The display device of claim 1, further comprising a plurality of second protruding portions, wherein
   the substrate includes a plurality of pixel areas adjacent in a first direction along the substrate, and
   the plurality of second protruding portions is separated from each other at a predetermined interval in a second direction perpendicular to the first direction.

5. The display device of claim 4, wherein
   the second protruding portion is a circular cylinder or a quadrangular column.

6. The display device of claim 1, wherein
   the second protruding portion is lattice-shaped and includes first portions extending in a first direction, and second portions extending in a second direction perpendicular to the first direction.

7. The display device of claim 1, wherein
   the substrate includes a plurality of pixel areas, and
   the second protruding portion is at a position where a boundary portion of the pixel areas parallel to a first direction and a boundary portion of the pixel areas perpendicular to the first direction cross each other.

8. The display device of claim 7, wherein
   the second protruding portion is a cross-shaped.

9. The display device of claim 1, wherein
   the substrate includes a plurality of pixel areas,
   the roof layer includes color filters of different colors in the pixel areas adjacent in a first direction,
   the color filters overlap each other in a boundary portion of the pixel areas, and
   the overlapping portion of the color filters defines the second protruding portion.

10. A display device comprising:
    a substrate;
    a thin film transistor on the substrate;
    a pixel electrode on the substrate and connected to the thin film transistor;
    a common electrode which is on the pixel electrode and extends towards the substrate to define a plurality of spaces between the common and pixel electrodes in which liquid crystal is disposed, wherein the plurality of spaces are separated from each other by the extended common electrode;
    a roof layer disposed on the common electrode and comprising a transparent organic material;
    an overcoat disposed on the roof layer and comprising an organic material;
    a first protruding portion protruded from a lower surface of the roof layer toward the substrate; and
    aligned with the first protruding portion in a cross-sectional thickness direction, a second protruding portion protruded between the overcoat and an upper surface of the roof layer,
    wherein the second protruding portion between the overcoat and the upper surface of the roof layer is disposed between a first portion of the overcoat disposed on a space of the plurality of spaces and a second portion of the overcoat disposed on another space of the plurality of spaces.

11. The display device of claim 10, wherein
    the first portion and the second portion of the overcoat are connected to each other at the second protruding portion which is aligned with the first protruding portion and between the overcoat and the upper surface of the roof layer.

12. The display device of claim 11, wherein
    the roof layer which extends to define the second protruding portion further extends to define the first protruding portion aligned with the second protruding portion.

* * * * *